US007312545B2

(12) United States Patent
Sasaki et al.

(10) Patent No.: US 7,312,545 B2
(45) Date of Patent: Dec. 25, 2007

(54) CONTROLLER FOR ELECTRIC POWER STEERING AND ELECTRIC POWER STEERING SYSTEM

(75) Inventors: Shoji Sasaki, Chiyoda-ku (JP); Ryoichi Kobayashi, Chiyoda-ku (JP); Norio Moriyama, Chiyoda-ku (JP); Hiroshi Ichige, Chiyoda-ku (JP)

(73) Assignee: Hitachi, Ltd., Tokyo (JP)

( * ) Notice: Subject to any disclaimer, the term of this patent is extended or adjusted under 35 U.S.C. 154(b) by 143 days.

(21) Appl. No.: 11/173,002

(22) Filed: Jul. 5, 2005

(65) Prior Publication Data

US 2006/0006749 A1 Jan. 12, 2006

(30) Foreign Application Priority Data

Jul. 6, 2004 (JP) ............................. 2004-198988

(51) Int. Cl.
*H02K 11/00* (2006.01)
(52) U.S. Cl. .................................. 310/68 R; 310/68 B
(58) Field of Classification Search .............. 310/68 R, 310/72
See application file for complete search history.

(56) References Cited

U.S. PATENT DOCUMENTS

| 5,770,902 | A | * | 6/1998 | Batten et al. .................. 310/71 |
| 6,078,155 | A | * | 6/2000 | Tominaga et al. ........... 318/293 |
| 6,166,464 | A | * | 12/2000 | Grant ........................ 310/68 R |
| 6,268,669 | B1 | * | 7/2001 | Wakao et al. ............... 310/67 R |
| 6,577,030 | B2 | * | 6/2003 | Tominaga et al. ......... 310/68 B |
| 6,707,185 | B2 | * | 3/2004 | Akutsu et al. ................. 310/71 |
| 6,750,574 | B2 | * | 6/2004 | Okazaki et al. ........... 310/68 B |
| 6,851,509 | B2 | * | 2/2005 | Hayakawa et al. .......... 180/444 |
| 6,864,605 | B2 | | 3/2005 | Shimizu et al. |
| 6,906,483 | B2 | * | 6/2005 | Tominaga et al. ........... 318/293 |
| 7,021,418 | B2 | * | 4/2006 | Tominaga et al. .......... 180/444 |
| 2002/0060105 | A1 | * | 5/2002 | Tominaga et al. .......... 180/443 |
| 2003/0127921 | A1 | | 7/2003 | Akutsu et al. |
| 2003/0173920 | A1 | | 8/2003 | Tominaga et al. |
| 2003/0200761 | A1 | * | 10/2003 | Funahashi et al. ......... 62/228.4 |

(Continued)

FOREIGN PATENT DOCUMENTS

DE   44 10 061 A1   9/1994

(Continued)

OTHER PUBLICATIONS

European Search Report dated Aug. 29, 2005 (Six Pages).

*Primary Examiner*—Burton Mullins
(74) *Attorney, Agent, or Firm*—Crowell & Moring LLP

(57) ABSTRACT

An electric power steering drive system provided with a motor with its torque pulsation reduced, and a controller characterized by excellent manufacturability.

The stator core of a motor is composed of an annular back core and a plurality of teeth created separately from the back core and secured on the inner periphery of the back core. An 8-pole/9-slot, 10-pole/9-slot or 10-pole/12-slot relationship is found between the number of the magnets of a rotor (number of poles) and the number of slots. The diameter of the stator coil is 1.0 mm or more. A motor controller comprises a power module, a conductor module and a control module. The terminal of the power module and the bus bar of the conductor module are connected by welding, whereas the terminal of the power module and terminal of the control module are connected by soldering.

4 Claims, 15 Drawing Sheets

U.S. PATENT DOCUMENTS

2005/0167183 A1* 8/2005 Tominaga et al. .......... 180/444

FOREIGN PATENT DOCUMENTS

| DE | 198 09 421 A1 | 4/1999 |
|---|---|---|
| EP | 0 753 448 A1 | 1/1997 |
| EP | 1 363 026 A2 | 11/2003 |
| EP | 1359661 A3 | 11/2003 |
| FR | 2 841 525 A1 | 1/2004 |
| JP | 2003-267233 | 9/2003 |

* cited by examiner

FIG. 3

| NUMBER OF POLES P \ NUMBER OF SLOTS S | 3 | 6 | 9 | 12 | 15 |
|---|---|---|---|---|---|
| 2 | ▭ |  |  |  |  |
| 4 | ▭ | ▭ |  |  |  |
| 6 |  |  | ▭ |  |  |
| 8 |  | ▭ | ▨ | ▭ |  |
| 10 |  |  | ▨ | ▩ | ▭ |

CONTROLLER FOR ELECTRIC POWER STEERING AND ELECTRIC POWER STEERING SYSTEM

CLAIM OF PRIORITY

The present application claims priority from Japanese application serial no. 2004-198988, filed on Jul. 6, 2004, the content of which is hereby incorporated by reference into this application.

FIELD OF THE INVENTION

The present invention relates to a controller for electric power steering and an electric power steering system.

BACKGROUND OF THE INVENTION

An electric power steering system of the prior art includes the one characterized by improvements in assembling ease, as disclosed in the Japanese Patent Laid-open No. 2003-267233, for example.

SUMMARY OF THE INVENTION

However, the system disclosed in the Japanese Application Patent Laid-open Publication No. 2003-267233 does not include a clear description of the configuration of the motor, and involves a manufacturability problem.

The electric power steering system for a vehicle is a system capable of generating supplementary steering force in conformity to the steering operation by a driver. This system helps the driver perform steering operation with smaller force. When the steering wheel of a vehicle is started from a standstill, much power is needed to steer the steering wheel because of a large friction between the steered wheel and ground surface. This will increase the power of the electric power steering system required to assist the driver. Thus, the electric power steering system is required to produce a large torque.

The object of the present invention is to provide a controller for electric power steering or an electric power steering system capable of generating a large torque.

(1) The present invention provides an electric power steering system comprising:

a motor for electric power steering; and a controller generating alternating current for driving said motor;

said motor for electric power steering comprising:

a stator equipped with a stator coil; and a rotor supported rotatably inside said stator;

said rotor comprising:

a rotor core; and a plurality of magnets secured on the surface of said rotor core;

said motor for electric power steering further comprising:

a connection board on the side of the stator for supplying alternating current to the stator coil;

said controller incorporating:

a power module equipped with a semiconductor switching device;

a conductor module; and a control module; inside a case;

wherein said control module controls the semiconductor switching device of the power module and supplies said power module with the control signal for generating the 3-phase alternating current to drive the motor for electric power steering;

wherein said power module contains a semiconductor switching device, and generates 3-phase alternating current for driving said motor in conformity to said control signal;

wherein said conductor module has a bottom with a plate-formed conductor and circuit parts, said plate-formed conductor forms a circuit for sending 3-phase alternating current to be supplied to the motor for electric power steering, the bottom of said conductor module is provided with holes, said filter and capacitor terminals protruding from the holes, and said protruding terminals and plate-formed conductor are connected by welding;

wherein said power module provided inside said case and plate-formed conductor of the conductor module are electrically connected;

wherein said power module and control module are connected by soldering; and wherein the 3-phase alternating current generated by the power module is supplied to the stator coil through the conductor module and the connection board for the motor for electric power steering.

The aforementioned structure provides an electrical power steering drive system characterized by excellent manufacturability, using a motor with its torque pulsation reduced.

(2) To achieve the aforementioned object, the present invention provides an electric power steering system comprising:

a motor for electric power steering; and a controller generating alternating current for driving the aforementioned motor;

the aforementioned motor for electric power steering comprising:

a stator equipped with a stator coil; and a rotor supported rotatably inside the aforementioned stator;

the aforementioned stator being equipped with a stator coil wherein the stator core is split, and the stator core is integrally constructed thereafter;

the aforementioned rotor comprising:

a rotor core; and a plurality of magnets secured on the surface of the aforementioned rotor core; wherein the aforementioned magnets whose stator side is formed in a curve and whose polarity reversing alternately in the circumferential direction, the aforementioned magnets being magnetized in the axial direction;

the aforementioned motor for electric power steering further comprising:

a connection board on the side of the stator for supplying alternating current to the stator coil;

the aforementioned controller incorporating:

a power module equipped with a semiconductor switching device;

a conductor module; and a control module; inside the case;

the aforementioned control module supplying the aforementioned power module with the control signal for generating the control signal for controlling the aforementioned semiconductor switching device and driving the motor for electric power steering;

the aforementioned power module containing a semiconductor switching device, and generating 3-phase alternating current for driving the aforementioned motor in conformity to the aforementioned control signal;

the aforementioned conductor module comprising:

a bottom formed of resin;

a plate-formed conductor provided on the aforementioned bottom;

a relay; and a capacitor;

wherein the aforementioned plate-formed conductor forms a circuit for sending 3-phase alternating current to be supplied to the motor for electric power steering;

wherein the aforementioned conductor module is secured onto one side of the case interior in such a way that the bottom thereof will be located at the upper position;

the aforementioned power module is arranged on the other side of the case interior; and the aforementioned power module and plate-formed conductor of the conductor module are electrically connected;

wherein a chamber is formed between the bottom of the case and the bottom of the conductor module arranged in such a way that the bottom thereof will be located at the upper position; and the aforementioned relay and capacitor are arranged in the chamber;

wherein a hole is provided on the bottom of the aforementioned conductor module arranged in such a way that the bottom thereof will be located at the upper position; the aforementioned relay and capacitor terminals protrude from the hole; and the aforementioned protruding terminals and plate-formed conductor are connected by welding; and wherein the alternating current generated by the power module is supplied to the stator coil through the connection board for the motor for electric power steering.

The aforementioned structure provides an electric power steering drive system characterized by excellent manufacturability, using a motor with its torque pulsation reduced.

(3) The electric power steering system described in the aforementioned (2) wherein welded connection between the aforementioned power module and conductor module is preferably accomplished by connecting a plurality of wires by wire bonding.

(4) The electric power steering system described in any one of the aforementioned (1) through (3) wherein the stator coil of the aforementioned motor for electric power steering is preferably provided with delta connection, and interphase coils are preferably connected in parallel.

(5) To achieve the aforementioned object, the present invention provides a controller for electric power steering wherein a power module containing a semiconductor switching device, a conductor module and a control module are arranged in a case;

wherein the aforementioned control module controls the semiconductor switching device of the power module and supplies the aforementioned power module with the control signal for generating the 3-phase alternating current to drive the motor for electric power steering;

wherein the aforementioned power module contains a semiconductor switching device, and generates 3-phase alternating current for driving the aforementioned motor in conformity to the aforementioned control signal; the aforementioned conductor module comprising:

a bottom formed of resin a plate-formed conductor provided on the aforementioned bottom;

a filter; and a capacitor;

wherein the aforementioned plate-formed conductor forms a circuit for sending 3-phase alternating current to be supplied to the motor for electric power steering, and a hole is provided on the bottom of the aforementioned conductor module, the aforementioned filter and capacitor terminals protruding from the hole, and the aforementioned protruding terminals and plate-formed conductor being connected by welding;

wherein the aforementioned conductor module is secured onto one side of the case interior, and the aforementioned power module is arranged on the other side of the case interior; the aforementioned power module and plate-formed conductor of the conductor module being electrically connected; and wherein the aforementioned control module is mounted on the aforementioned power module, and the aforementioned power module and control module are connected by soldering.

The aforementioned structure provides an electric power steering drive system characterized by excellent manufacturability, using a motor with its torque pulsation reduced.

(6) To achieve the aforementioned object, the present invention provides controller for electric power steering wherein a power module containing a semiconductor switching device, a conductor module and a control module are arranged in a case;

wherein the aforementioned control module controls the semiconductor switching device of the power module and supplies the aforementioned power module with the control signal for generating the 3-phase alternating current to drive the motor for electric power steering;

wherein the aforementioned power module contains a semiconductor switching device, and generates 3-phase alternating current for driving the aforementioned motor in conformity to the aforementioned control signal;

the aforementioned conductor module comprising:

a bottom formed of resin;

a plate-formed conductor provided on the aforementioned bottom;

a filter; and a capacitor;

wherein the aforementioned plate-formed conductor forms a circuit for sending 3-phase alternating current to be supplied to the motor for electric power steering;

wherein the aforementioned conductor module is secured onto one side of the case interior in such a way that the bottom thereof will be located at the upper position, the aforementioned power module is arranged on the other side of the case interior, and the aforementioned power module and plate-formed conductor of the conductor module is electrically connected;

wherein a chamber is formed between the bottom of the case and the bottom of the conductor module arranged in such a way that the bottom thereof will be located at the upper position, and the aforementioned filter and capacitor are arranged in the chamber;

wherein a hole is provided on the bottom of the aforementioned conductor module arranged in such a way that the bottom thereof will be located at the upper position, the aforementioned filter and capacitor terminals protrude from the hole, and the aforementioned protruding terminals and plate-formed conductor are connected by welding; and wherein the aforementioned control module is mounted on the aforementioned power module, and the aforementioned power module and control module are connected by soldering.

The aforementioned structure provides an electric power steering drive system characterized by excellent manufacturability, using a motor with its torque pulsation reduced.

(7) To achieve the aforementioned object, the present invention provides a controller for electric power steering wherein a power module containing a semiconductor switching device, a conductor module and a control module are arranged in a case;

wherein the aforementioned control module controls the semiconductor switching device of the power module and supplies the aforementioned power module with the control signal for generating the 3-phase alternating current to drive the motor for electric power steering;

wherein the aforementioned power module contains a semiconductor switching device, and generates 3-phase alternating current for driving the aforementioned motor in conformity to the aforementioned control signal;

wherein the aforementioned conductor module contains a longitudinal structural member formed of resin, a bottom, a plate-formed conductor arranged on the aforementioned bottom, a relay and a capacitor; and the plate-formed conductor constitutes an electric circuit for sending 3-phase alternating current to be supplied to the motor for electric power steering;

wherein the aforementioned conductor module is secured onto one side of the case interior in such a way that the bottom thereof will be located at the upper position, a chamber is formed between the bottom of the case and the bottom of the conductor module arranged in such a way that the bottom thereof will be located at the upper position, and the aforementioned relay and capacitor are arranged in the chamber;

wherein a hole is provided on the bottom of the aforementioned conductor module arranged in such a way that the bottom thereof will be located at the upper position, the aforementioned filter and capacitor terminals protrude upwardly from the hole, part of the plate-formed conductor is bent upward, and the upward bent part of the plate-formed conductor, and the protruding terminals of the aforementioned filter and the aforementioned capacitor are electrically connected;

wherein the aforementioned power module is arranged in the chamber arranged between the conductor module of the case interior and the other side of the case interior;

wherein the aforementioned power module and the plate-formed conductor of the conductor module are electrically connected through wire bonding;

wherein the aforementioned control module is mounted on the aforementioned power module, and the aforementioned power module and control module are connected by soldering; and wherein a connector for supplying the motor for electric power steering with 3-phase alternating current is arranged on the side of the aforementioned case on the conductor module side.

The aforementioned structure provides an electric power steering drive system characterized by excellent manufacturability, using a motor with its torque pulsation reduced.

EFFECTS OF THE INVENTION

The present invention provides an electric power steering system capable of generating a large torque.

Further, the embodiments of the present invention to be described below offer the following advantages:

An electric power steering system characterized by operation comfort is provided. To put it more specifically, in the following embodiment, the motor cogging torque can be kept at a very low level. This can minimize the torque pulsation and provides superb operation comfort. For safe steering of a vehicle, it is important to ensure that the driver concentrates his or her attention on steering. If the steering comfort is not satisfactory during the operation of the steering wheel, the driver cannot concentrate his or her attention on steering. To ensure safety, it is essential to reduce the cogging torque and improve the operation comfort.

Further, the following embodiment allows a large torque to be generated, and the size motor or drive current generation apparatus to be reduced.

The motor drive current generation apparatus of the following embodiment is easily manufactured, and is characterized by superb manufacturability. The process of manufacturing is required to have the following advantages: a structure for permitting use of a machine or equipment for automatic connection of wiring terminals inside the apparatus to be manufactured; and a structure for ensuring that the circuit device of the product to be manufactured are effectively arranged for the aforementioned connection work. The following embodiment provides the structure suited for automation of the manufacturing work and the effective arrangement of the circuit device.

BRIEF DESCRIPTION OF THE DRAWINGS

FIG. 3 is an explanatory diagram representing the relationship between the numbers of poles P and slots S in an AC motor;

DESCRIPTION OF THE PREFERRED EMBODIMENTS

Figure 6:
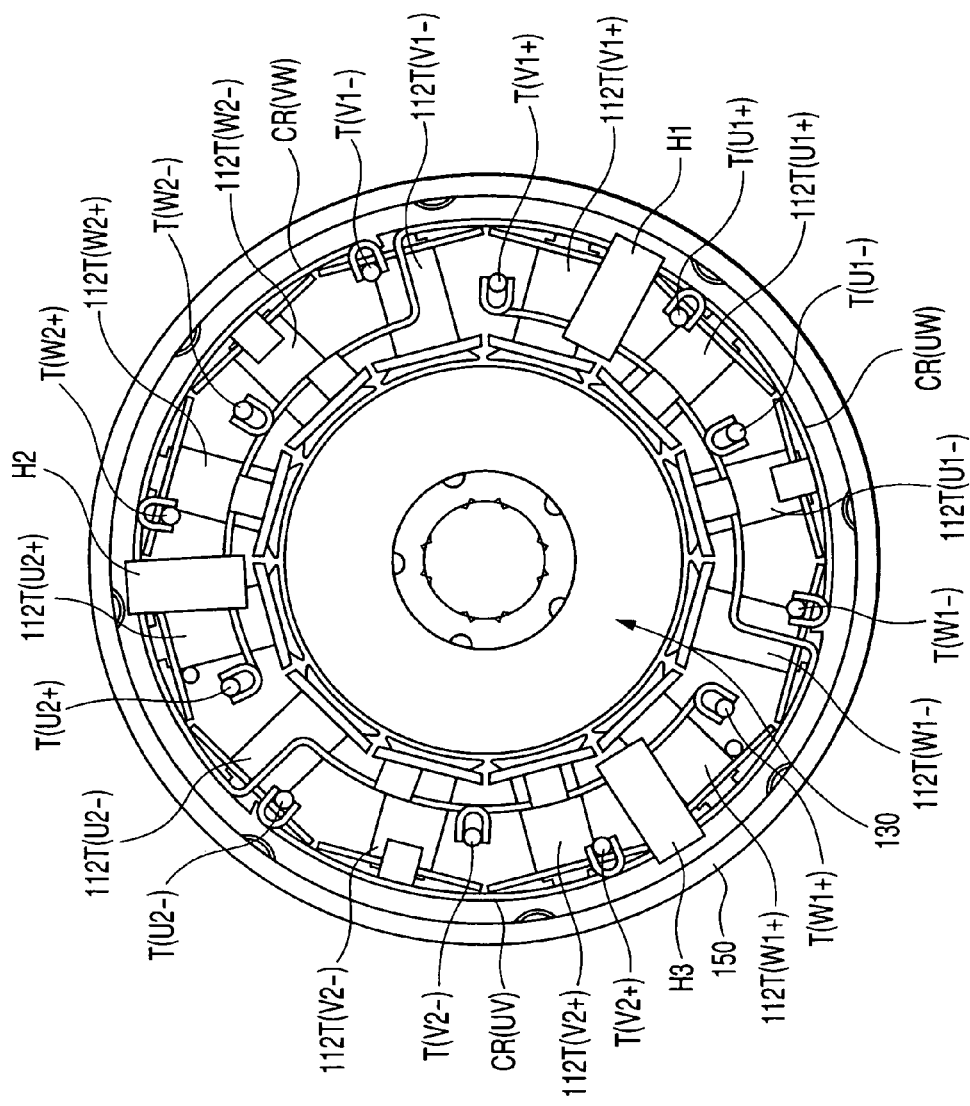
FIG. 6 is a side view representing the electrical connection of the stator coils in the motor for electric power steering as an embodiment of the present invention.
Figure 7:
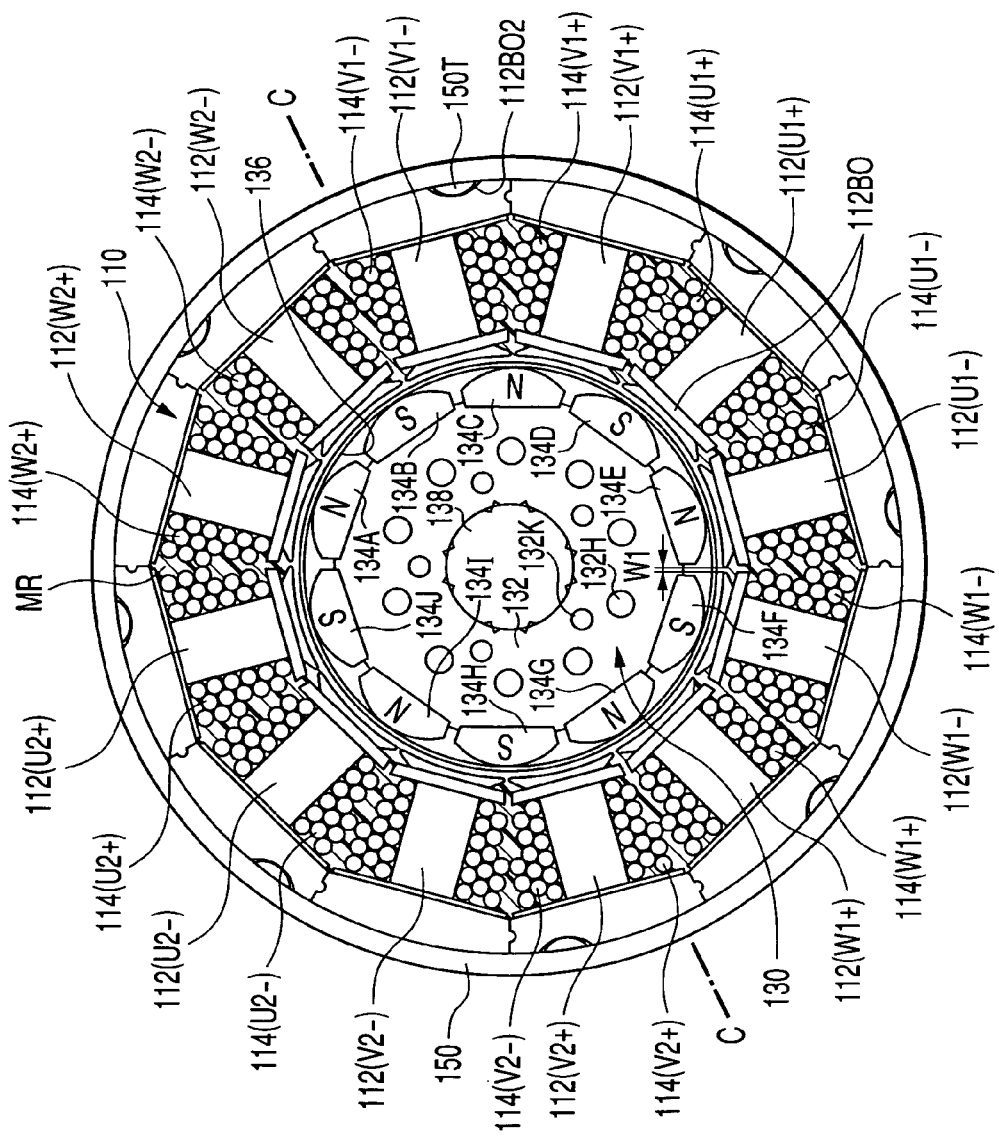
FIG. 7 is a view in the direction of the arrow A-A in FIG. 1, representing the configuration of another stator.
Figure 8:
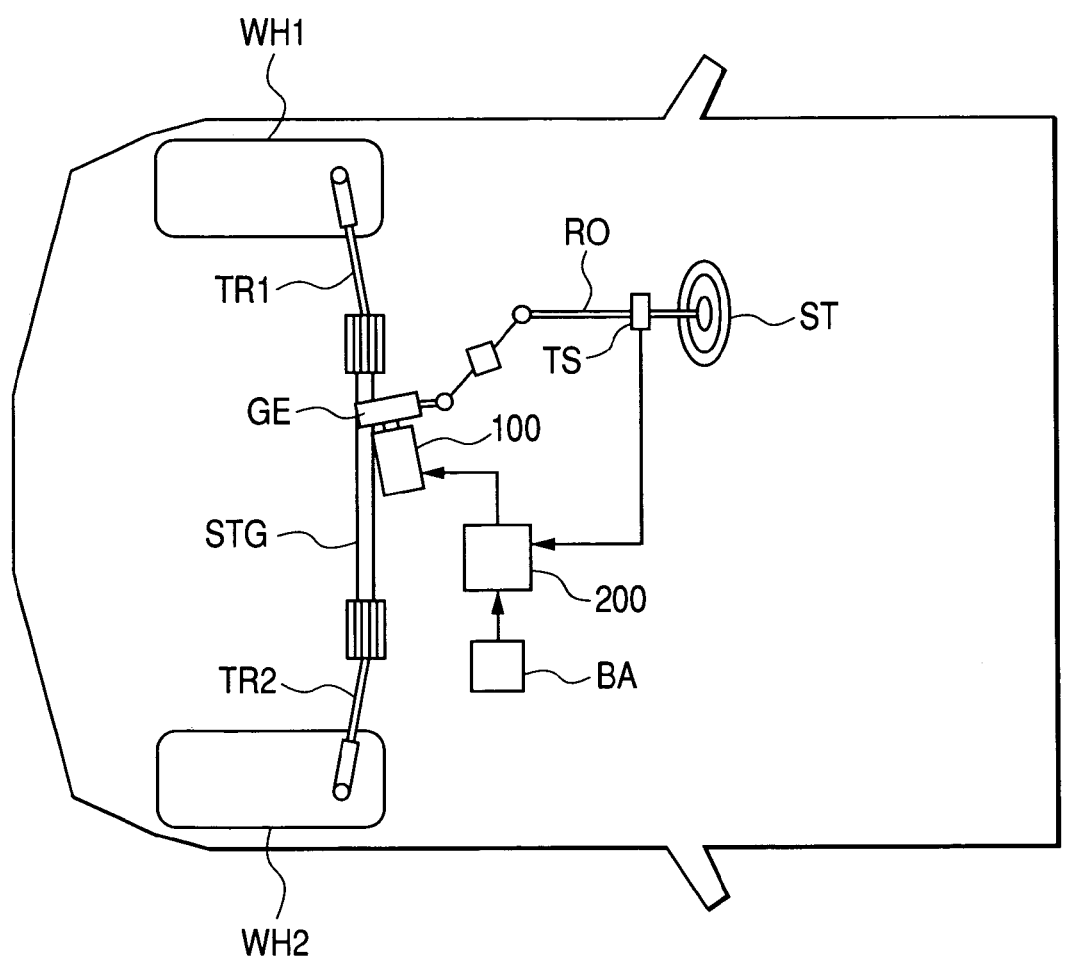
FIG. 8 is a system configuration diagram representing the configuration of the electric power steering system using the motor for electric power steering as an embodiment of the present invention.
Figure 9:
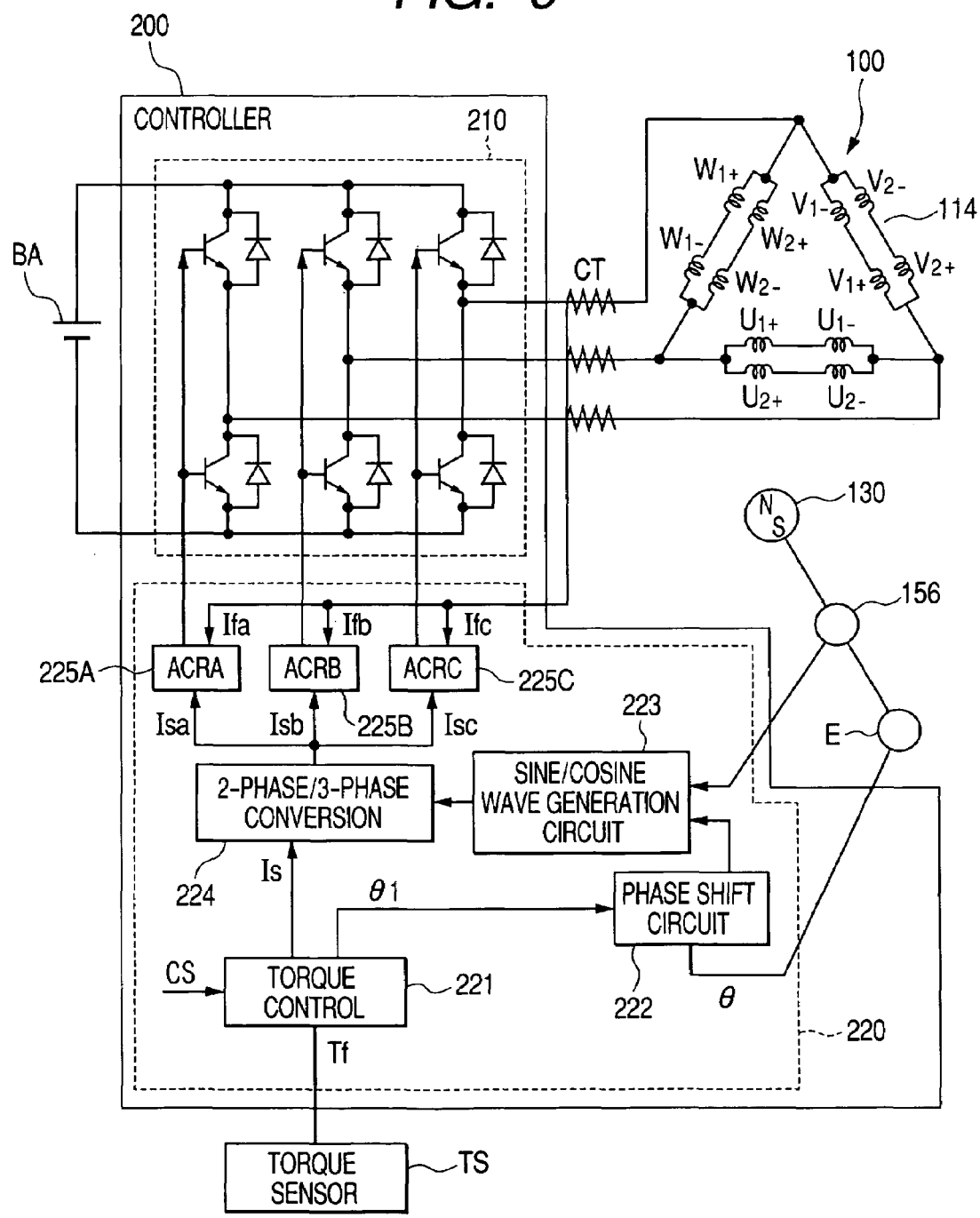
FIG. 9 is a block diagram representing the configuration of the controller for controlling the motor for electric power steering according to the present embodiment.

Referring to FIGS. 1 through 9, the following describes the motor for electric power steering and the electric power steering system as a first embodiment of the present invention. FIGS. 1 through 7 are drawings representing the structure and operation of the torque generation motor. FIGS. 8 and 9 are drawings showing the electric power steering system.

Figure 1:
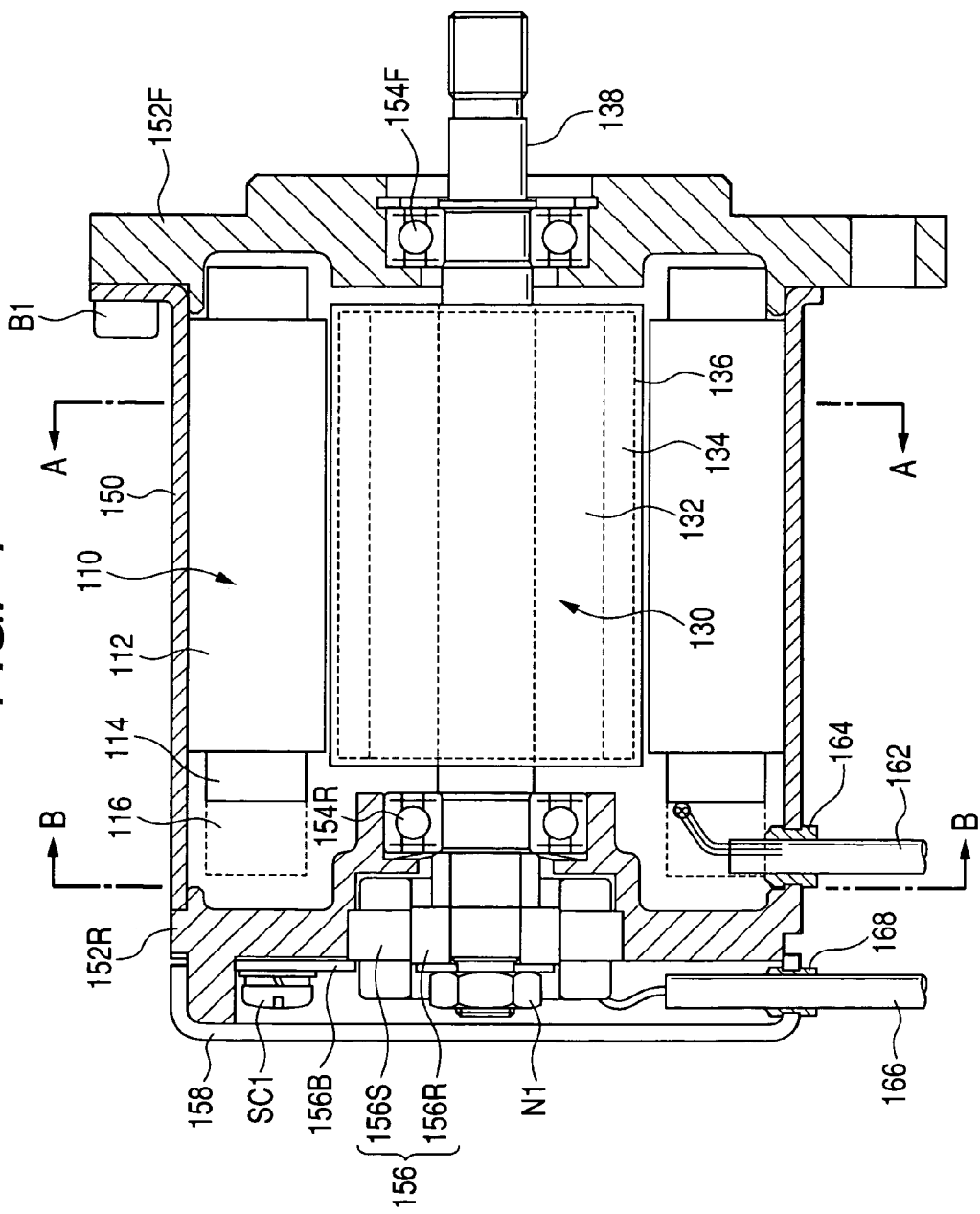
FIG. 1 is a transverse cross sectional view showing the structure of the motor for electric power steering as an embodiment of the present invention.
Figure 2A:
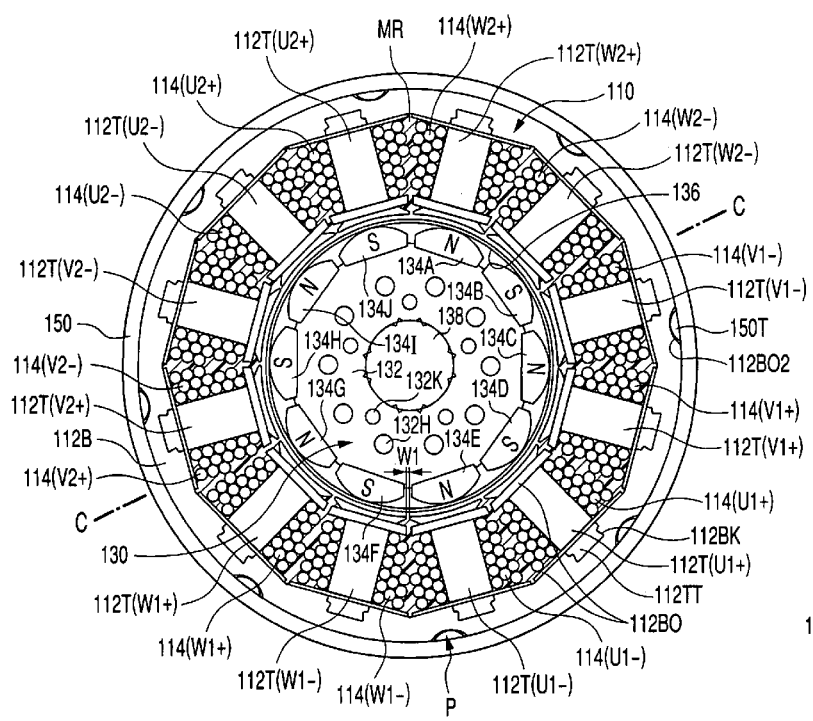
FIG. 2 is a cross sectional view taken along the line A-A of FIG. 1.
Figure 2B:
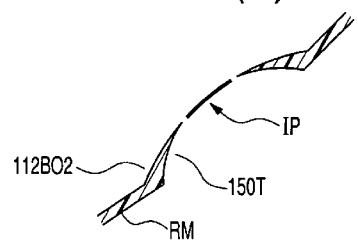

In the first place, the following describes the motor for electric power steering as an embodiment of the present invention, with reference to FIGS. 1 and 2. FIG. 1 is a transverse cross sectional view showing the structure of the motor for electric power steering. FIG. 2 is a cross sectional view taken along the line A-A of FIG. 1.

The motor for electric power steering 100 (hereinafter referred to as "motor") is a surface magnet type synchronous motor comprising a stator 110 and the rotor 130 rotatably supported inside the stator 110. The motor 100 is driven by the battery mounted on the vehicle, for example, by power supplied from a 14-volt power source (12-volt power source), a 24-volt power source, 42-volt power source (36-volt power source) or a 48-volt power source.

The stator 110 comprises a stator core 112 formed of a magnetic substance laminated with a silicon steel plate in the direction of the rotary axis, and a stator coil 114 held inside the slot of the stator core 112. The stator core 112 is composed of an annular back core 112B and a plurality of teeth 112T created separately from this back core and mechanically fixed onto the back core thereafter, as shown in FIG. 2. Each of the teeth is wound with a stator coil 114. In this example, the stator core 112 is divided into the annular back core 112B and teeth 112T, but can be divided otherwise. For example, as will be described later with reference to FIG. 7, the back core 112B and teeth 112T can be integrated into one piece, and the back core 112B can be divided among the teeth 112T.

As described above, the stator core 112 is divided and the stator coil is mounted on the stator teeth. After that, the stator is assembled. This is because the air gap between adjacent teeth on the rotor side of each tooth and hence the fluctuation of magnetic circuit constant in the circumferential direction are reduced, whereby the cogging torque is decreased. If the space between teeth on the teeth surface opposite to the rotor surface is reduced, the mounting of the stator coil will become difficult. In the present embodiment, the air gas between teeth is smaller than the width of the stator coil. This makes it difficult to enter the stator coil into the slot from the aforementioned air gap. Accordingly, the stator core 112 is divided and the stator coil is mounted on the teeth. After that, divided pieces of the stator core 112 are integrated into one stator core. This process produces the stator 110 equipped with stator coil.

In the embodiment shown in FIGS. 1 and 2, the back core 112B is manufactured in advance and a plurality of teeth equipped with the stator coil are secured on this back core 112B. According to this procedure, the back core 112B is connected in the circumferential direction, and therefore it is easier to obtain a high precision of the teeth on the rotor side in the completed stator and to minimize a manufacturing error in the radial direction. The stator coil 114 is wound by a distributed or concentrated winding method. The stator coil 114 subjected to distributed winding is characterized by excellent field weakening control and occurrence of reluctance torque. Downsizing of the motor and reduction of winding resistance are very important for the motor for electric power steering. The length of the coil end of the stator coil 114 can be reduced by concentrated winding of the stator coil 114. This arrangement reduces the length of the motor 100 in the direction of rotary axis. Further, since the length of the end of the stator coil 114 can be reduced, the resistance of the stator coil 114 can be reduced, and rise in motor temperature and heat generation with respect to current can also be reduced. Reduction in coil resistance minimizes the motor copper loss. Thus, the percentage of the energy consumed by copper loss relative to the entire energy inputted into the motor can be reduced and the efficiency of the output torque relative to input energy can be improved.

As described above, the motor for electric power steering is driven by the power source mounted on a vehicle. The output voltage of the aforementioned power source is often low. A series circuit is equivalently formed by the switching device with an inverter formed across the power source terminal, the aforementioned motor and other current supply circuit connecting means. In the aforementioned circuit, a total of the terminal voltage of the circuit constituent devices becomes the terminal voltage of the aforementioned power source. Thus, the terminal voltage of the motor for supplying power to the motor is lowered. To ensure the current flowing into the motor under this condition, it is crucial to keep the copper loss of the motor low. For this reason, a low-voltage system of 50 volts or less is often used as the power source mounted on a vehicle. The concentrated winding method is preferably applied to the stator coil 114. This is very important especially when a 12-volt power source is used.

The motor for electric power steering is placed close to the steering column or close to a rack-and-pinion mechanism. Downsizing is required in either case. In the downsized structure, the stator winding must be fixed in position. It is also important to make winding work easy. Concentrated winding ensures easier winding work and fixing work than distributed winding.

The end of the stator coil 114 is molded. The power steering motor preferably keeps the torque fluctuation such as cogging torque to a very low level. After the stator section has been assembled, machining may be performed again inside the stator in order to improve dimensional precision in the radial direction. Chips will be produced by such machining operation. Means must be provided to prevent these chips from entering the end of the stator coil. The coil end is preferably molded.

The stator coil 114 is composed of three phases; U, V and W. Each of them is composed of a plurality of coils. These coils are connected by the connection board 116 (CR in FIG. 6) provided on the left of the stator coil 114. The connection board 116 (CR in FIG. 6) is composed of such a conductor board as copper shaped to elongate in the circumferential direction. The stator coil terminal arranged in the circumferential direction is connected thereto.

The motor for electric power steering is required to provide a large torque. For example, when the vehicle is stopped or is running close to the stopped state, if the steering wheel is turned at a high speed, the aforementioned motor is required to provide a large torque due to the friction coefficient between the steering wheel and ground surface. In this case, a large current is supplied to the stator coil. This current can be 50 amperes or more, although it depends on conditions. Further, it can be 70 or 150 amperes. To ensure safe supply of such a large current and reduce generation of heat by the aforementioned current, it is important to use the connection board 116. Current is supplied to the stator coil through the connection board 116, whereby the connection resistance is lowered and voltage drop resulting from copper loss is minimized. This arrangement provides easy supply of a large current and reduces the time constant for current startup caused by the operation of the inverter device.

The stator core 112 equipped with the stator coil 114 is molded by resin together to form an integral piece. This integral stator subassembly is press-fitted into the cylindrical yoke 150 formed of metal such as aluminum and is fixed therein. The motor for electric power steering on board a vehicle is subjected to various forms of vibration, as well as the impact from the wheel. Further, it is used under the condition of a drastic temperature change. It may be exposed to the temperature of 40 degrees Celsius below zero, or 100 degrees Celsius or more due to temperature rise. Further, means must be taken to prevent water from entering the motor. In order for the stator to be fixed to the yoke 150 under these conditions, the structure is designed so that there is no hole other than a screw hole on the outer periphery of at least the stator core of the cylindrical yoke. The stator is preferably press-fitted into the cylindrical metal. In this embodiment, after press-fitting, screws are used to fix it in position, from the outer periphery of the yoke so as to fix the yoke and stator in position. In addition to press fitting, locking is provided.

The rotor 130 comprises a rotor core 132 formed of a magnetic substance laminated with a silicon steel plate; a plurality of magnets 134 as permanent magnets bonded on the surface of the rotor core 132 by adhesive; and a magnet cover 136 composed of non-magnetic substance provided on the outer periphery of the magnets 134. The magnet 134 is a rare-earth magnet and is composed of neodymium, for example. The rotor core 132 is fixed on the shaft 138. A plurality of magnets 134 are bonded on the surface of the rotor core 132 by adhesive. At the same time, the outer periphery is covered with a magnet cover 136, whereby the magnet 134 is prevented from being thrown away. The aforementioned magnet cover 136 is made stainless steel (commonly known as SUS). It can be wound with tape. Use of the stainless steel provides easier production. As described above, the motor for electric power steering is subjected to vibration and thermal change, and the structure of providing a stainless steel cover 136 is suited to hold the permanent magnet that is easy to break down, thereby preventing the magnet from breaking down. Even if it breaks down, it is prevented from being thrown away, as described above.

A front flange 152F is arranged on one end of the cylindrical yoke 150. The yoke 150 and front flange 152F are fixed together by bolts B1 arranged at intervals of 120 degrees. A rear flange 152R is press-fit into the on the end of the yoke 150. A bearing 154F and a bearing 154R are mounted on the front flange 152F and rear flange 152R, respectively. A shaft 138 and a rotor 130 fixed on this shaft 138 are rotatably supported by these bearings 154F and 154R.

A resolver 156R is secured on one end of the shaft 138 (end on the left of the drawing) by nuts. A resolver stator 156S is mounted on the rear flange 152R. The resolver stator 156S can be mounted in position by securing the resolver holding plate 156B on the rear flange 152R by screw SC1. The resolver 156 is composed of the resolver stator 156S and resolver rotor 156R. The rotation of the resolver rotor 156R is detected by the resolver stator 156S, whereby the rotary position of the rotor 130, namely, the position of the magnets 134 mounted on the surface of the rotor 130 can be detected. A rear holder 158 is mounted on the outer periphery of the rear flange 152R so as to cover the resolver 156.

Power is supplied from an external inverter to each of the U, V and W phases connected by the connection board CR (116 in FIG. 1) through a power cable 162. The power cable 162 is mounted on the yoke 150 by a grommet 164. The rotor rotational position (magnetic pole position) signal detected from the resolver stator 156S is taken out by the signal cable 166. The signal cable 166 is connected to the rear holder 158 by the grommet 168.

Referring to FIG. 2, the following describes the detailed configuration of the stator 110 and rotor 130. FIG. 2 is a view taken along line A-A of FIG. 1. The same reference numerals as those in FIG. 1 indicate the same parts.

In the first place, the configuration of the stator 110 will be explained. The stator core 112 shown in FIG. 1 is composed of annular back core 112B and a plurality of teeth created separately from this back core. The back core 112B is formed by lamination of the magnetic sheet metals of SUS or the like stamped out by a press.

In the present embodiment, the tooth 112T is composed of twelve independent teeth 112T (U1+), 112T (U1−), 112T (U2+), 112T (U2−), 112T (V1+), 112T (V1−), 112T (V2+), 112T (V2−), 112T (W1+), 112T (W1−), 112T (W2+), and 112T (W2−). The teeth 112T (U1+) . . . 112T (W2−) are wound with stator coils 114 (U1+), 114 (U1−), 114 (U2+), 114 (U2−), 114 (V1+), 114 (V1−), 114 (V2+), 114 (V2−), 114 (W1+), 114 (W1−), 114 (W2+), and 114 (W2−), respectively in a concentrated winding mode.

Here the stator coil 114 (U1+) and the stator coil 114 (U1−) are wound in such a way that current runs through the coil in the opposite directions. The stator coil 114 (U2+) and the stator coil 114 (U2−) are also wound in such a way that current runs through the coil in the opposite directions. The stator coil 114 (U1+) and the stator coil 114 (U2+) are wound in such a way that current runs through the coil in the opposite directions. Further, the stator coil 114 (U1−) and the stator coil 114 (U2−) are also wound in such a way that current runs through the coil in the opposite directions. The relation of the directions of current flow for the stator coil 114 (V1+), stator coil 114 (V1−), stator coil 114 (V2+) and stator coil 114 (V2−), and the relation of the directions of current flow for the stator coil 114 (W1+), stator coil 114 (W1−), stator coil 114 (W2+) and stator coil 114 (W2−) are also the same as those in the case of U phases.

Twelve teeth 112T and stator coils 114 are manufactured in the same manner. The tooth 112T (U1+) and stator coil 114 (U1+) will be taken as an example to explain the assembling process. The stator coil 114 (U1+) is a molded coil formed in such a way as to wind the tooth 112T (U1+). The stator coil 114 (U1+) as the molded coil is molded together with a bobbin 112BO. An integrated piece consisting of the stator coil 114 (U1+) and bobbin 112BO is fitted into the tooth 112T (U1+) from its rear. The tip end of the tooth 112T (U1+), namely, the side facing the rotor 130 is expanded in the circumferential direction. The bobbin 112BO and stator coil 114 (U1+) serve as stoppers in this expanded section, and are anchored therein. A concave portion 112TT shaped to make a tight fit with a convex portion 112BK formed on the inner periphery of the back core 112B is formed on the rear of the tooth 112T (U1+). The concave portion 112TT of the tooth 112T (U1+) wound with the molded stator coil 114 (U1+) is press-fitted into the convex portion 112BK of the back core 112B so that the tooth 112T (U1+) is fastened on the back core 112B. The above description applies also to the process of mounting the stator coil 114 (U1−) through stator coil 114 (W2−) on the other teeth 112T (U1−) through 112T (W2−), and the process of mounting the other teeth 112T (U1−) through 112T (W2−) on the back core 112B.

Twelve stator coils 114 and teeth 112T fastened on the back core 112B are integrally-molded by the thermosetting resin MR, whereby a stator is formed. The side, facing the rotor 130, as the inner peripheral surface of the molded stator, namely, as the tip ends of the teeth 112T (U1−) through 112T (W2−) is machined to improve the roundness of the inner diameter, whereby the air gap variation between the stator 110 and rotor 130 is reduced. Further, as compared with the case where molding is not performed, integral molding process improves the shrink mark resulting from the heat generated by electric conduction of the stator coil 114. Further, the molding process protects the stator coil and teeth against vibration. Further, the stator coil 114 in the stator slot is secured in the slot by mold and the air gap in the slot is filled with the molding agent. After the stator has been formed, the inner side of the teeth is machined to reduce the cogging torque. Since the slot interior is filled with resin, chips are prevented from entering the slot through the air gap between teeth. Further, mechanically strong structure is provided to guard against the trouble caused by the vibration in machining operation, whereby the stator coil is protected. The advantages provided by the above-mentioned machining operation will be specifically described with reference to the description of the embodiment shown in FIGS. 1, 2 and 6. For example, when the air gap between the outer periphery of the rotor core of the rotor 130 and the inner periphery of the teeth of the stator 110 is 3 mm (3000 μm), the roundness of the inner diameter of about ±30 μm will occur due to the production error of the back core 112B and teeth 112T, and assembling error of the back core 112B and teeth 112T at the time of press fitting and assembling. The roundness is equivalent to 1% (=30 μm/3000 μm) of the air gap, and therefore a cogging torque is produced by the roundness of inner diameter. However, after molding, the inner diameter is machined. This process reduces the cogging torque resulting from the roundness of the inner diameter. Reduction of the cogging torque improves the steering comfort.

The stator as the integral mold is press-fitted into the yoke 150 and is secured in position. In this case, a plurality of concave portions 150T are formed inside the yoke 150. Further, a plurality of concave portions 112BO2 are formed on the outer periphery of the back core 112B. Their engagement prevents the back core 112B from rotating in the circumferential direction of the yoke 150, relative to the yoke 150.

The stator coil 114 (U1+) and stator coil 114 (U1−), and stator coil 114 (U2+) and stator coil 114 (U2−) are positioned symmetrically, relative to the center of the stator 110. To be more specific, the stator coil 114 (U1+) and stator coil 114 (U1−) are located adjacent to each other, and the stator coil 114 (U2+) and stator coil 114 (U2−) are also located adjacent to each other. Further, the stator coil 114 (U1+) and stator coil 114 (U1−), and stator coil 114 (U2+) and stator coil 114 (U2−) are positioned symmetrically with respect to a line, relative to the center of the stator 110. To put it another way, the stator coil 114 (U1+) and stator coil 114 (U2+) are placed symmetrically with respect to a line, relative to the broken line C-C passing through the center of the shaft 138. Further, the stator coil 114 (U1−) and stator coil 114 (U2−) are placed symmetrically.

Similarly, the stator coil 114 (V1+) and stator coil 114 (V1−), and stator coil 114 (V2+) and stator coil 114 (V2−) are positioned symmetrically with respect to a line. The stator coil 114 (W1+) and stator coil 114 (W1−), and stator coil 114 (W2+) and stator coil 114 (W2−) are also positioned symmetrically with respect to a line.

Further, the adjacent stator coils 114 of the same phase are continuously wound using one wire; namely, the stator coil 114 (U1+) and stator coil 114 (U1−) are used one wire to continuously form two winding coils the stator coil 114 (U1+) and 114 (U1−). Coils formed in a continuous shape are inserted into respective teeth, and are wound on the teeth, whereby stator coils are formed. Similarly, the stator coil 114 (U2+) and stator coil 114 (U2−) are continuously wound using one wire. Continuous coils are inserted into respective teeth. Similarly, the stator coil 114 (V1+) and stator coil 114 (V1−), stator coil 114 (V2+) and stator coil 114 (V2−), the stator coil 114 (W1+) and stator coil 114 (W1−), and stator coil 114 (W2+) and stator coil 114 (W2−) are also handled in the same procedure.

Such a symmetric layout with respect to a line and winding of two adjacent coils of the same phase in a connected form—not in a separate form—ensure improved workability. Further, the structure of the connection board will be simplified for the stator coil connection work, when the same or difference phases are connected by a connection board, as will be discussed later with reference to FIG. 5.

The following describes the configuration of the rotor 130. The rotor 130 comprises: a rotor core 132 composed of a magnetic substance; ten magnets 134 (134A, 134B, 134C, 134D, 134E, 134F, 134G, 134H, 134I and 134J) bonded on the surface of the rotor core 132 by adhesive; and a magnet cover 136 arranged on the outer periphery of the magnets 134. The rotor core 132 is designed in a laminated structure wherein the lamination board composed of magnetic substance is laminated in the axial direction of the shaft and is secured on the shaft 138.

When the surface (side opposite to the teeth 112T of the stator) is an N-pole, the magnets 134 are energized in the radial direction to ensure that the back side thereof (side bonded to the rotor core 132) will be an S-pole. Further, when the surface (side opposite to the teeth 112T of the stator) is an S-pole, the magnets 134 are energized in the radial direction to ensure that the back side thereof (side bonded to the rotor core 132) will be an N-pole. The adjacent magnets 134 are energized in such a way that the energized poles will be reversed alternately with each other in the circumferential direction. For example, if the surface of the magnet 134A is attracted by the N-pole, the surfaces of the adjacent magnets 134B and 134J are attracted by the S-pole. To put it another way, when the surfaces of the magnets 134A, 134C, 134E, 134G and 134I are attracted by the N-pole, the magnets 134B, 134D, 134F, 134H and 134J are attracted by the S-pole.

The magnets 134 each have a curved surface (semicylindrical cross section). The curved surface (semicylindrical cross section) can be defined as a structure wherein the thickness of the right and left in the radial direction is smaller than that at the center in the radial direction. To put it more specifically, a curved surface (semicylindrical cross section) is defined as a structure wherein the surface in contact with the rotor core is almost flat and both ends in the circumferential direction extend approximately in the radial direction. The left and right sides of approximately radial extensions are connected with the approximately radial extensions on both ends in the circumferential direction. This configuration is shown in FIGS. 2 and 7. Such a curved surface (semicylindrical cross section) structure allows the magnetic flux to be distributed approximately in the form of a sinusoidal wave. Then the induced voltage waveform resulting from addition of the sinusoidal wave voltage can be changed into an approximate sinusoidal wave. Further, the amount corresponding to pulsation can be reduced. Reduction in pulsation improves the steering comfort. When a magnet is formed by attraction to the ring-like magnetic substance, the magnetic flux can be distributed in the form similar to the sinusoidal wave by control of the energizing force. However, this method is accompanies by difficulties in precise magnetization. Generation of some cogging torque must be tolerated. The rotor core 132 is provided with ten large-diameter through-holes 132H formed on the concentric circle and five small-diameter recesses 132K on the inner concentric circle of the through-holes 132H. The rotor core 132 is composed of a lamination of the sheet metal of magnetic substance such as SUS having been stamped out by press molding. The recesses 132K are formed by crimping the sheet metal at the time of press molding. When a plurality of sheet metals are laminated, the recesses 132K are fitted with each other, whereby positioning is performed. The through-hole 132H is intended to cut down the inertia. The rotor balance can be improved by the through-hole 132H. The outer periphery of the magnet 134 is covered by the magnet cover 136 to prevent the magnet 134 from being thrown away. The back core 112B and rotor core 132 can be formed simultaneously from the same sheet metal by stamping out by a press.

As described above, the rotor 130 of the present embodiment has ten magnets 134 and ten poles. Also as described above, twelve teeth 112T are provided. The number of slots formed between adjacent teeth is 12. To put it another way, the motor of the present invention is a 10-pole 12-slot surface magnetic type synchronous motor.

Referring to FIG. 3, the following describes the relationship between the numbers of poles P and slots S in an AC motor. FIG. 3 is an explanatory diagram representing the relationship between the numbers of poles P and slots S in an AC motor. A combination given by hatching using horizontal lines indicates the relationship between the numbers of poles P and slots S that can be used in a three-phase AC motor (brushless motor). Namely, the available combinations include 2 poles and 3 slots, 4 poles and 3 slots, 4 poles and 6 slots, 6 poles and 9 slots, 8 poles and 6 slots, 8 poles and 9 slots, 8 poles and 12 slots, 10 poles and 9 slots, 10 poles and 12 slots, and 10 poles and 15 slots. Of these combinations, a 10-pole/12-slot combination provided with right and left oblique lines indicates the numbers of motors and slots in the present embodiment. The 8-pole/9-slot and 10-pole/9-slot combinations shown by left oblique lines will be described later. The WPS motor shown in FIG. 1 is a small-sized motor having an outer diameter of 85 mm. Such a small-sized motor cannot be achieved if the number of poles N is 12 or more, and is therefore not illustrated.

The motors having 2 poles and 3 slots, 4 poles and 3 slots, 4 poles and 6 slots, 6 poles and 9 slots, 8 poles and 6 slots, 8 poles and 12 slots, and 10 poles and 15 slots are provided with similar characteristics.

The motor having 6 poles and 9 slots will be taken up as an typical example in the following explanation:

The 10-pole/12-slot motor of the present embodiment provides a higher usage rate of the magnetic flux of a magnet than the 6-pole/9-slot AC motor. To be more specific, the 6-pole/9-slot motor has a winding factor (usage rate) kw of 0.87 and a skew factor ks of 0.96. The usage rate (kw·ks) of the magnetic flux of the magnet is 0.83. In the meantime, the 10-pole/12-slot motor of the present embodiment has a winding factor (usage rate) (kw) of 0.93 and a quality factor ks of 0.99. Thus, it has a usage rate of 0.92. This means that the 10-pole/12-slot motor of the present embodiment improves the usage rate of the magnetic flux of a magnet (kw·ks).

The period of the cogging torque corresponds to the least common multiple of the numbers of poles P and slots S, and therefore the period of the cogging torque in the 6-pole/9-slot AC motor is 18. Thus, the period of the cogging torque in the 10-pole/12-slot motor of the present embodiment can be reduced to 60. This shows that a reduction of cogging torque is ensured.

Further, the cogging torque resulting from poor roundness of inner diameter can also be reduced. To be more specific, assuming that the cogging torque resulting from the out-of-roundness of inner diameter in the 6-pole/9-slot AC motor is 3.7, that in the 10-pole/12-slot motor of the present embodiment can be 2.4, with the result that the cogging torque resulting from the out-of-roundness of inner diameter can be reduced.

Further, in the present embodiment, machining is applied to the inner diameter of the molded stator to improve the roundness of the inner diameter. This leads to a further reduction in the cogging torque resulting from the poor roundness of inner diameter.

Referring to FIG. 4, the following describes the actual measurements of the cogging torque in the motor for electric power steering in the present embodiment. FIG. 4 is an explanatory diagram representing the actual measurements of the cogging torque in the motor for electric power steering as an embodiment of the present embodiment shown in FIGS. 1 and 2.

Figure 4A:
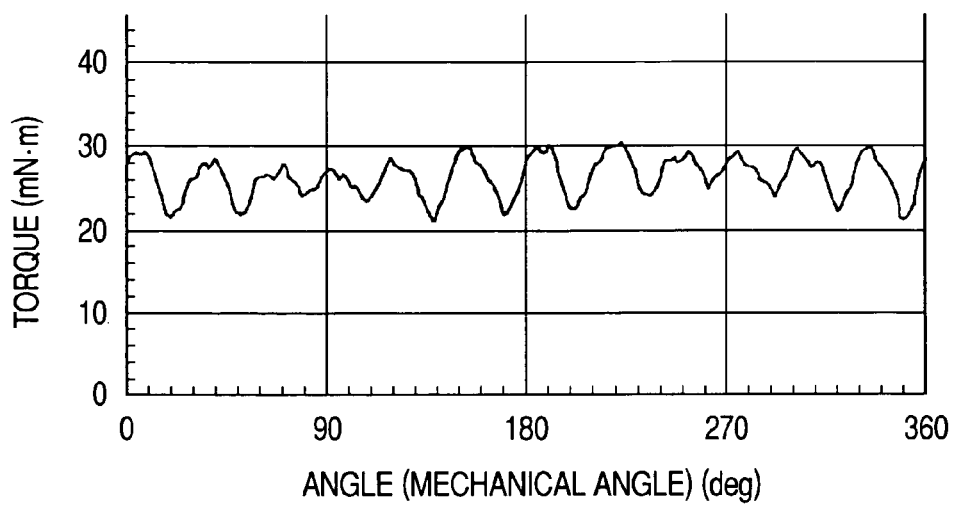
FIG. 4 is an explanatory diagram representing the actual measurements of the cogging torque in the motor for electric power steering as an embodiment of the present embodiment shown in FIGS. 1 and 2.
Figure 4B:
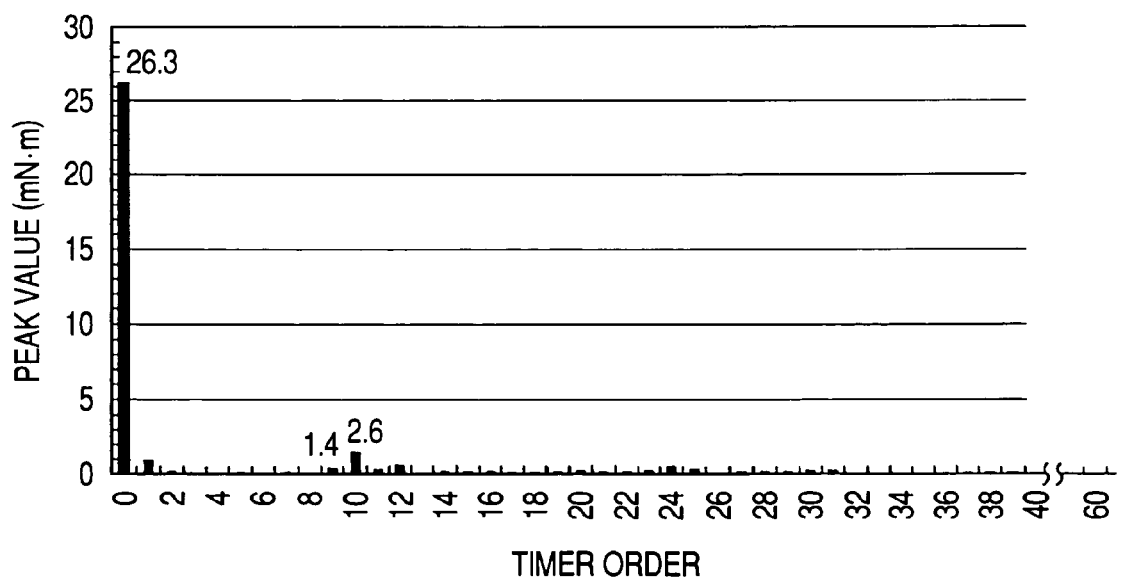

FIG. 4(A) shows the cogging torque (mNm) measured for the angle (mechanical) ranging from 0 through 360 degrees. FIG. 4(B) shows the peak value (mNm) by separating the high frequency component of the cogging torque shown in FIG. 4(A) for each time order. As described above, time order "60" indicates the period of the cogging torque in a 10-pole/12-slot motor and the cogging torque having occurred is almost zero.

Time order "10" is the result of variation in the magnetic field force of the 10-pole magnet. As described above, use of a semicylindrical magnet reduces the cogging torque resulting from variation in magnetic field force down to 1.4. The time order "12" is the result of the variation of each tooth of a 12-slot stator. Since the roundness of the inner diameter is improved by cutting subsequent to molding, the cogging torque resulting from variation of the teeth is also reduced to 2.6.

Time order "0" indicates a DC component, so-called a loss torque (friction coefficient produced at a speed of zero). The loss torque can also be lowered to 26.3 mNm. Even when a driver has released the steering wheel, the loss torque is small as compared to the restoring force of steering wheel to get back to the original position, with the result that the restoring force of the steering wheel is improved.

As described above, since each cogging component can be reduced, the cogging torque can be reduced to 9 mNm, as shown in FIG. 4(A). The maximum torque of the EPS motor is 4.5 Nm, and therefore the cogging torque can be reduce as low as 0.2% (=9 mNm/4.5 Nm) (3/1000 or less of the rated level). The loss torque can also be reduced to 0.57% (=26.3 mNm/4.5 Nm).

The motor 100 of the present embodiment is a motor using an on-board battery (e.g. output voltage of 14 volts) as the power source thereof. The motor 100 is mounted close to the steering system or the rack of a rack/pinion mechanism for transmitting the power of the steering system to the wheel. This requires downsizing due to the limited installation space. In the meantime, a large torque (e.g. 4.5 Nm) is required for provide power assistance to the steering system.

When an attempt is made to deliver the required torque from the AC servo motor powered by a 100 VAC power source, the motor current of about 5 amperes is sufficient. However, when 14 VAC obtained by DC-to-AC conversion of the 14 VDC is used for driving, as in the present embodiment, the motor current must be 70 through 100 amperes in order to get about the same torque with about the same volume. To get such a large current, the diameter of stator coil 114 must be increased to as large as 1.6 mm. In this case, the number of turns of the stator coil 114 is 14 (T). The number of turns of the stator coil 114 is in the range from 9 through 21, although it depends on the diameter of the stator coil 114. When the diameter of the stator coil 114 is 1.8 mm, the number of turns is 9. Here if the coil having a diameter of 1.6 mm instead of the coil having a diameter of 1.8 is used for winding, coil space factor can be improved by 75%, for example. Since the coil space factor can be improved, the current density of the conductor can be reduced in relative terms. This arrangement reduces the copper loss and keeps down motor temperature rise. Further, it improves the rpm/torque characteristics. Some of the recent powered vehicles are equipped with a 42-volt battery. In this case, this arrangement reduces the motor current. The number of turns of the stator coil 114 is in the range from 20 through 30.

In the adjacent teeth 112T, the space W1 (e.g. tooth 112T (U1−) of the expanded section of the tip (side facing the rotor 130) of the teeth 112T and the space Wi (circumferential space at the position closest to the circumferential direction) of the expanded section of the tip of the teeth 112T (U1−) and 112T (W1−) are 1 mm. Reducing the teeth space in this manner decreases the cogging torque. Even if vibration is applied to the motor, the line of the stator coil 114 is larger than the space W1, and this prevents stator coil 114 from being dropped out on the rotor side through teeth. The appropriate space W1 between adjacent teeth is 0.5 through 1.5 mm, for example, which is smaller than the diameter of the stator coil 114. When the stator coil has dropped out of the teeth, the motor will be locked. In this case, rotation of the steering system will be disabled, and this will create a vehicle safety problem. However, as in the present embodiment, the space W1 of the adjacent teeth is smaller than the diameter of the stator coil 114. This arrangement ensures vehicle safety.

Figure 5:
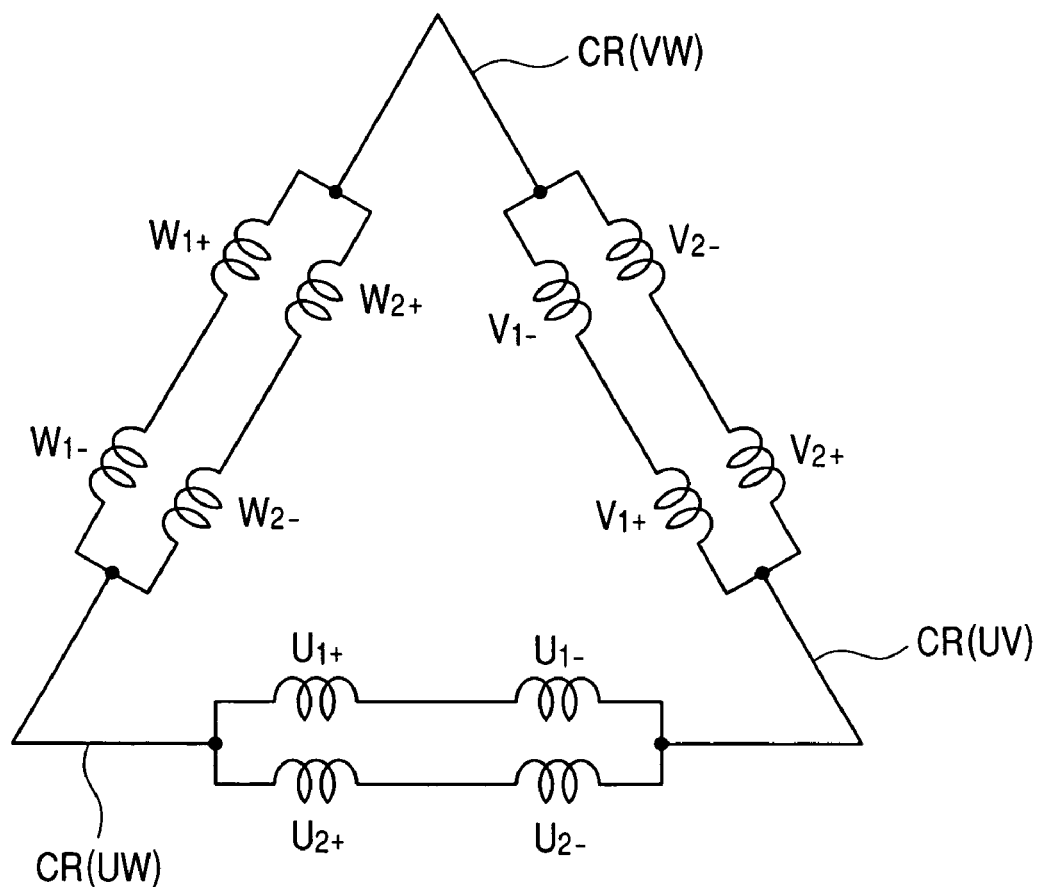
FIG. 5 is a connection diagram of stator coils in the motor for electric power steering as an embodiment of the present invention.

Referring to FIGS. 5 and 6, the following describes the connection of stator coils in a motor for electric power steering in the present embodiment. FIG. 5 is a connection diagram of stator coils in the motor for electric power steering as an embodiment of the present invention. FIG. 6 is a side view representing the electrical connection of the stator coils in the motor for electric power steering as an embodiment of the present invention. FIG. 6 is a view in the direction of the arrow B-B in FIG. 1. The same reference numerals as those in FIG. 2 indicate the same parts.

In FIG. 5, coil U1+denotes a stator coil 112T (U1+) shown in FIG. 2. Coils U1−, U2+, U2−, V1+, V1−, V2+, V2−, W1+, W1−, W2+, W2− indicate the stator coils 112T (U1−) . . . 112T (W2−) of FIG. 2, respectively.

In the stator coil of the present embodiment, a delta connection is used for U, V and W phases. Each phase constitutes a parallel circuit. To be more specific about the U phase, a parallel connection of coil U2+ and coil U2− is provided for the series connection of coil U1+ and coil U1−. Here as described above, the coil U1+ and coil U1− are formed by continuous winding of a wire. This is also applicable to the V and W phases.

A star-connection method can also be used for this connection. However, use of delta connection allows the terminal voltage to be reduced as compared with the use of star connection. For example, assume that the voltage across the motor terminal is E. In star-connection, voltage applied to each winding is E/the square root of 3. Start connection reduces the voltage applied to the winding of each layer as compared to delta connection, but the current running through each layer is the square root of 3 times that in the delta connection. Hence if delta connection shown in FIG. 5 is used, the current running through the winding of each phase can be reduced to one over the square root of 3 times the current in delta connection, where the voltage applied to the winding of each phase is multiplied by the square root of 3.

In the embodiment shown in FIG. 5, the current running through the coils (W1+, W1−, W2+and W2−), coils (V1+, V1−, V2+and V2−) and coils (U1+, U1−, U2+ and U2−) across terminal of each phase is reduced to one over the square root of 3 times that in the case of star-connection, hence the number of turns of the coil can be increased by using a wire of small diameter. Further, a parallel circuit is used for the winding between phases. To put it more specifically, parallel connection is used between coils W1 and W2, between V1 and V2, and between U1 and U2. This configuration reduces the current running through each coil as compared to the case where four coils are series connected. In this respect, this allows use of a smaller-diameter wire and hence improves the coil space factor, with the result that the wire as a stator material is bent more easily and the manufacturability is improved.

When star-connection is applied to the stator coil, the current value increases, as described above. If this problem is taken into account, star-connection can be applied to the stator coil. Delta connection causes current value to be reduced, whereas the star-connection, where circulating current by the third harmonic runs, has the advantage of avoiding this circulating current.

Referring to FIGS. 5 and 6, the following describes the method of connection using a connection board for three phases and for each phase:

As shown in FIG. 5, coils U1−, U2−, V1+and V2+ are connected by the connection board CR (UV); coils V1−, V2+, W1+ and W2+ are connected by the connection board CR (VW); and coils U1+, U2+, W1− and W2− are connected by the connection board CR (UW). This arrangement provides a 3-phase delta connection.

As shown in FIG. 6, three connection boards CR (UV), CR (VW) and CR (UW) are used. The connection boards CR (UV), CR (VW) and CR (UW) are formed by bending and machining a bus bar type connection board, namely, a rectangular copper wire bent in the circumferential direction to form a circular arc so as to feed a large current. Each of the connection boards has the same shape. For example, the connection board CR (UV) is formed by a connection between a circular arc of a small radius and a circular arc of a large radius. Other connection boards CR (VW) and CR (UW) are made in the same structure. These connection boards CR (UV), CR (VW) and CR (UW) are retained by the holders H1, H2 and H3 in the state displaced 120 degrees in the circumferential direction. This arrangement ensures easy manufacturer.

In the meantime, in FIG. 6, the stator coil terminal T (U1+) is one terminal of the stator coil 114 (U1+) wound on the teeth 112T (U1+). The stator coil terminal T (U1−) is one terminal of the stator coil 114 (U1−) wound on tooth 112T (U1−). As described above, the stator coil 114 (U1+) and stator coil 114 (U1−) are formed of one wire that constitutes continuous coils. Hence two terminals T (U1+) and T (U1−) are present for two coils 114 (U1+) and 114 (U1−). The stator coil terminals T (U2+), T (U2−), T (V1+), T (V1−), T (V2+), T (V2−), T (W1+), T (W1−), T (W2+) and T (W2−) each are the terminals on one side of the stator coils 114 (U2+), . . . (W2+).

The stator coil terminals T (U1−), (U2−), (V1+) and (V2+) are connected by the connection board CR (UV), whereby the coils U1−, U2− and V1+, V2+ shown in FIG. 5 are connected by the connection board CR (UV). The stator coil terminal T (V1−), T (V2−), T (W1+) and T (W2+) are connected by the connection board CR (VW), whereby the coils V1−, V2− and W1+, W2+ shown in FIG. 5 are connected by the connection board CR (VW). The stator coil terminals T (W1−), (W2−), (U1+) and (U2+) are connected by the connection board CR (UW), whereby the coils U1+, U2+ and W1−, W2− shown in FIG. 5 are connected by the connection board CR (UW).

The above-mentioned connection boards CR (UV), CR (VW) and CR (UW) are provided with the U-shaped portions for connection with the coil terminal of each phase of the stator 1 winding in the number (4 in this case) required to connection. These U-shaped portions sandwich the coil terminals of respective phases mechanically, and are connected with them further by welding or soldering. When consideration is given to supply of a large current, welding is preferred for connection.

As described above, the connection board is used to supply current to the coil of each phase. This arrangement provides a simple coil end structure and easy wiring work. It also permits effective connection between the coil end and connection board and provides an excellent characteristic for supply of a large current. The aforementioned connection board is bent in the circumferential direction of the motor. The connection boards are arranged at an equal angle in the circumferential direction, e.g. in the state displaced 120 degrees. Because of the regularity between the layout and connection, this arrangement ensures easy manufacturing and minimizes a production error.

Referring to FIG. 7, the following describes another example of the configuration of the stator 110. FIG. 7 is a view in the direction of the arrow A-A in FIG. 1. The same reference numerals as those in FIG. 2 indicate the same parts.

In the stator 110 shown in FIG. 2, the stator core 112 is composed of an annular back core 112B and a plurality of teeth 112T provided separately from this annular back core 112B. By contrast, in the present example, it is composed in a split structure wherein the back core and teeth are formed in an integral structure as a unit. It is split in conformity to each tooth. In the present embodiment, twelve slots are provided. Twelve T-shaped teeth-integrated split back cores are 112 (U1+), 112 (U1−), 112 (U2+), 112 (U2−), 112 (V1+), 112 (V1−), 112 (V2+), 112 (V2−), 112 (W1+), 112 (W1−) and 112 (W2+), 112 (W2−). To be more specific, the annular back core 112B of FIG. 2 is split into twelve pieces in the circumferential direction. A tooth is integrated with each of the split back core piece. The teeth-integrated split back cores 112 (U1+) . . . 112 (W2−) are composed of a lamination of the sheet metal of magnetic substance such as SUS having been stamped out by press molding. The rotor 130 is formed as shown in FIG. 2.

The teeth 112T is composed of twelve independent teeth 112T (U1+), 112T (U1−), 112T (U2+), 112T (U2−), 112T (V1+), 112T (V1−), 112T (V2+), 112T (V2−), 112T (W1+), 112T (W1−), 112T (W2+) and 112T (W2−) are wound on teeth sections of the teeth-integrated split back cores 112 (U1+) . . . 112 (W2−), respectively in a concentrated winding mode, as shown in FIG. 2. The direction of winding the stator coils 114 (U1+) . . . 114 (W2−) is the same as given in FIG. 2.

Stator coils 114 (U1+) . . . 114 (W2−) are wound on the teeth-integrated split back cores 112 (U1+) . . . 112 (W2−). After that, the concave portions formed on the end face of the teeth-integrated split back cores 112 (U1+) . . . 112 (W2−) in the circumferential direction are press-fitted with the concave portions shaped for fitting, so that the assembling of the stator 110 completes. Under this condition, integral molding is provided by thermosetting resin MR, whereby a stator is produced. The inner peripheral surfaces of the molded stator, namely, the tips of the teeth of the teeth-integrated split back cores 112 (U1+) . . . 112 (W2−) as the surfaces radially opposite to the rotor 130, are provided with machining. This arrangement improves the roundness in the inner diameter of the stator 110, and reduces the variation of the air gap between the stator 110 and rotor 130. Further, integral molding improves the sink caused by the heat generated by electric conduction of the status coil 114, as compared to the case where integral molding is not adopted. Further, the molding process protects the stator coil and teeth against vibration. Machining of the inner diameter subsequent to molding reduces the cogging torque caused by the roundness of the inner diameter. Reduction of cogging torque improves the operation comfort of the steering system.

This integrally molded stator is press-fitted inside the yoke 150 and fixed therein. In this case, a plurality of concave portions 150T are formed inside the yoke 150. A plurality of concave portions 112BO2 are formed on the outer periphery of the annular back core 112B. Engagement between the two prevents the back core 112B from rotating in the circumferential direction relative to the yoke 150.

Referring to FIG. 8, the following describes the configuration of the electric power steering system using the motor for electric power steering according to the present embodiment: FIG. 8 is a system configuration diagram representing the configuration of the electric power steering system using the motor for electric power steering as an embodiment of the present invention.

When the steering ST is turned, the rotation drive force is decelerated by a manual steering gear STG through the rod RO and is transmitted to right and left tie rods TR1 and T2 to steer the right and left wheel WH1 and WH2, whereby the right and left wheel WH1 and WH2 are steered.

The motor 100 of the present embodiment is mounted close to the manual steering gear STG. The drive force is transmitted to the manual steering gear STG through a gear GE. The rod RO is equipped with a torque sensor TS, which detects the rotation drive force (torque) applied to the steering ST.

Based on the output of the torque sensor TS and the output of the vehicle speed sensor (not illustrated), the controller 200 controls calculates the target torque of the motor 100. In this calculation, it is effective to calculate the target torque of the motor 100 giving further consideration to the rotation speed and rotation acceleration of the motor 100. This arrangement will provide more optimized control with greater comfort. From the viewpoint of safety, the motor temperature and current value is preferred detected to set a limit to the maximum current value. The current and voltage value of the motor 100 are detected, and the current for conduction of the motor 100 is controlled in such a way that the current value as the output torque of the motor 100 will be the current value corresponding to the target torque. Power of the controller 200 and motor 100 is provided by a battery BA.

The aforementioned configuration indicates a rack type power steering system with the EPS mounted close to the rack/pinion mechanism. The motor 100 of the present embodiment is also applicable to a column type power steering system with the motor mounted close to the steering system. In the column type power steering system, a torque sensor and the aforementioned motor for assisting the torque is placed on the portion of the steering column immediately below the steering wheel. The motor conforming to the present embodiment and the control system including the inverter to be described with reference to the following drawing can be used directly.

Referring to FIG. 9, the following describes the configuration of the controller for controlling the motor for electric power steering according to the present embodiment. FIG. 9 is a functional block diagram representing the configuration of the controller for controlling the motor for electric power steering according to the present embodiment. The controller 200 comprises a power module 210 having a function as an inverter; and a control module 220 for controlling the power module 210. The DC voltage from the battery BA is converted to the 3-phase AC voltage by the power module 210 having a function as an inverter, and is supplied to the stator coil 114 of the motor 100. To be more specific, the output terminals of a power module 21 are each connected to the connection board CR (VW), CR (UV) and CR (UW) described in FIG. 5 or FIG. 6.

The torque controller 221 in the control module 220 outputs the target current value Is as the target output torque Te of the motor according to the torque Tf detected by the torque sensor TS in the steering ST and the output CS of the vehicle speed sensor. Further, it outputs the torque command, namely, current command Is and the rotary angle θ1 of the rotor 130 by PI control (P: a proportional item and I: an integrated item) and others.

A phase shift circuit 222 shifts the phase of the pulse from the encoder E, namely, the rotor position information θ in response to the command of the rotary angle θ1 from the torque controller (ASR) 221, and outputs it. Based on the information from the resolver 156 for detecting the position of the magnetic pole of the permanent magnet of the rotor 130 and the information θ on the phase-shifted rotor position sent from the phase shift circuit 222, a sine/cosine wave generator 2223 generates the sinusoidal wave output obtained by phase-shifting of the induced voltage of each winding (three phases in this case) of the stator coil 114. The amount of phase-shift can be zero.

A 2-phase/3-phase conversion circuit 224 outputs the current commands Isa, Isb and Isc to respective phases in response to the current command Is from the torque control circuit (ASR) 221 and the output from the sine/cosine wave generator 223. These phases are separately provided with current control systems (ACR) 225A, 225B and 225C, respectively. The 2-phase/3-phase conversion circuit 224 sends the signals conforming to the current commands Isa, Isb and Isc, and current detection signals Ifa, Ifb and Ifc from the current detector CT, to the inverter 210 to control the currents of these phases. In this case, the composite current of phases is always produced at the position at right angles with the magnetic flux of the magnetic field or at the phase-shifted position.

The target output torque is calculated according to the torque sensor output and vehicle speed, and the 3-phase supply current to the motor is calculated based on the result of this calculation. Based on the target current as the calculated 3-phase supply current, i.e. the aforementioned current commands (Ifa, Ifb and Ifc), and the actual values of the 3-phase currents (the aforementioned Ifa, Ifb and Ifc) with respect to it, the control signal for the inverter is outputted and is supplied to the inverter.

The aforementioned description refers to the 10-pole/12-slot motor. Then the 8-pole/9-slot and 10-pole/9-slot motors shown by left oblique lines in FIG. 3 will be described. The control method, current supply configuration and basic motor structure are the same as those of the 10-pole/12-slot motor already explained.

The 8-pole/9-slot and 10-pole/9-slot motors provide a higher usage rate of the magnetic flux of a magnet than the 6-pole/9-slot AC motor. To be more specific, the 6-pole/9-slot motor has a usage rate (kw.ks) of the magnetic flux of the magnet amounting to 0.83, as described above. In the meantime, the 8-pole/9-slot and 10-pole/9-slot motors have a winding factor of 0.95 kw, and a skew factor (ks) of 1.00. Thus, the 8-pole/9-slot and 10-pole/9-slot motors have a usage rate (kw.ks) of 0.94. This means that the 8-pole/9-slot motor and 10-pole/9-slot motors improve the usage rate of the magnetic flux of a magnet (kw.ks).

The period of the cogging torque corresponds to the least common multiple of the numbers of poles P and slots S, and therefore the period of the cogging torque in the 6-pole/9-slot AC motor is 18. Thus, the period of the cogging torque in the 8-pole/9-slot and 10-pole/9-slot motors can be reduced to 72. This shows that a reduction of cogging torque is ensured.

Further, the cogging torque resulting from poor roundness of inner diameter can also be reduced. To be more specific, assuming that the cogging torque resulting from the out-of-roundness of inner diameter in the 6-pole/9-slot AC motor is 3.7, the cogging torque in the 8-pole/9-slot and 10-pole/9-slot motors can be reduced to 1.4, with the result that the cogging torque resulting from the out-of-roundness of inner diameter can be reduced. Further, machining is applied to the inner diameter of the molded stator subassembly to improve the roundness of the inner diameter. This leads to further reduction in the cogging torque resulting from the poor roundness of inner diameter.

In the 8-pole/9-slot and 10-pole/9-slot motors, parallel connection of the series circuit of the coil U2+ and coil U2− cannot be configured, as viewed from the U phase, with respect to the series circuit of the coil U1+ and coil U1−, as in the 10-pole/12-slot motor described above with reference to FIG. 5. This requires a series connection of the coil U1+, coil U1−, coil U2+ and coil U2−.

Referring to FIGS. 10 through 16, the following describes the controller for controlling the motor for electric power steering of the present embodiment.

Figure 10:
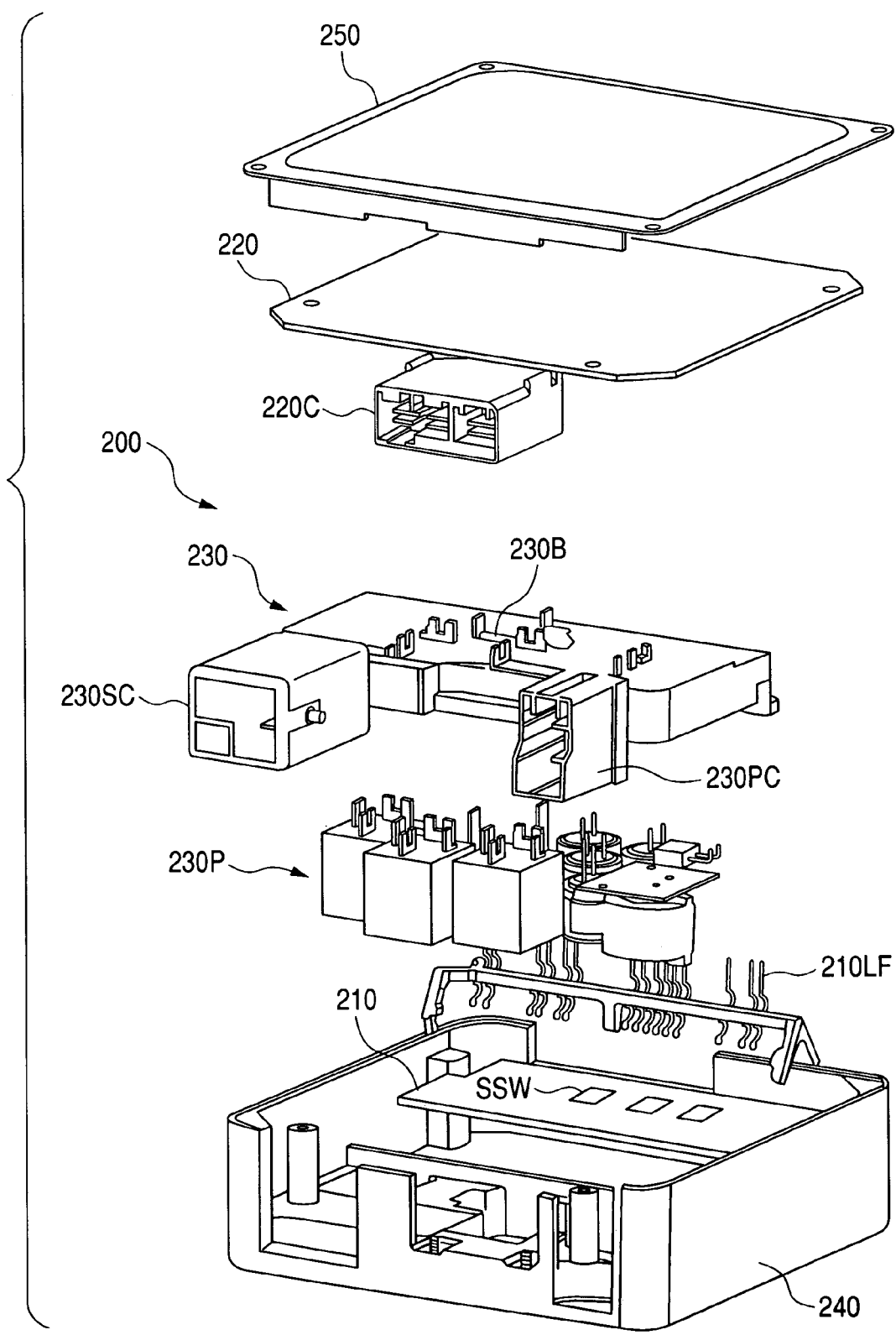
FIG. 10 is a perspective exploded view representing the configuration of the controller for controlling the motor for electric power steering in the present embodiment of the present invention.

FIG. 10 is a perspective exploded view representing the configuration of the controller for controlling the motor for electric power steering in the present embodiment of the present invention.

As shown in FIG. 10, the motor controller 200 comprises a power module 210, a control module 220, a conductor module 230, a case 240 and a shield cover 250.

In the power module 210, a wiring pattern is formed on a metallic substrate through an insulator. An inverter composed of a semiconductor switching device SSW such as an IGBT described with reference to FIG. 9 is mounted on the wiring pattern. The power module 210 is fixed with one end of each of multiple lead frames 210 LF by soldering. The lead frames 210 LF is used for electrical connection of the power module 210 and control module 220.

In the control module 220, a CPU and driver circuit are mounted on the PCB substrate. In the illustrated state, the CPU and driver circuit are mounted on the lower surface of the substrate. The signal connector 220C is mounted on the control module 220.

The conductor module 230 is integrally connected with the bus bar 230B as a power line by molding. At the same time, it is connected integrally with the motor connector 230SC as a terminal for supplying motor current to the motor and the power connector 230PC supplied with power by the battery. The parts 230P such as a relay, a coil and a capacitor are mounted in advance on the conductor module 230. The terminal of the parts 230P and bus bar 230B are secured by TIG welding (arc welding).

The case 240 is made of aluminum. At the time of assembling, the power module 210 and conductor module 230 are fixed by screws in the case 240. The control module 220 is also fixed by screws on the power module 210 and conductor module 230. The other end of the lead frames 210LF is connected with the terminal of the control module 220 by soldering. The shield cover 250 is fixed by screws in the final step, whereby the motor controller 200 is manufactured.

Figure 11:
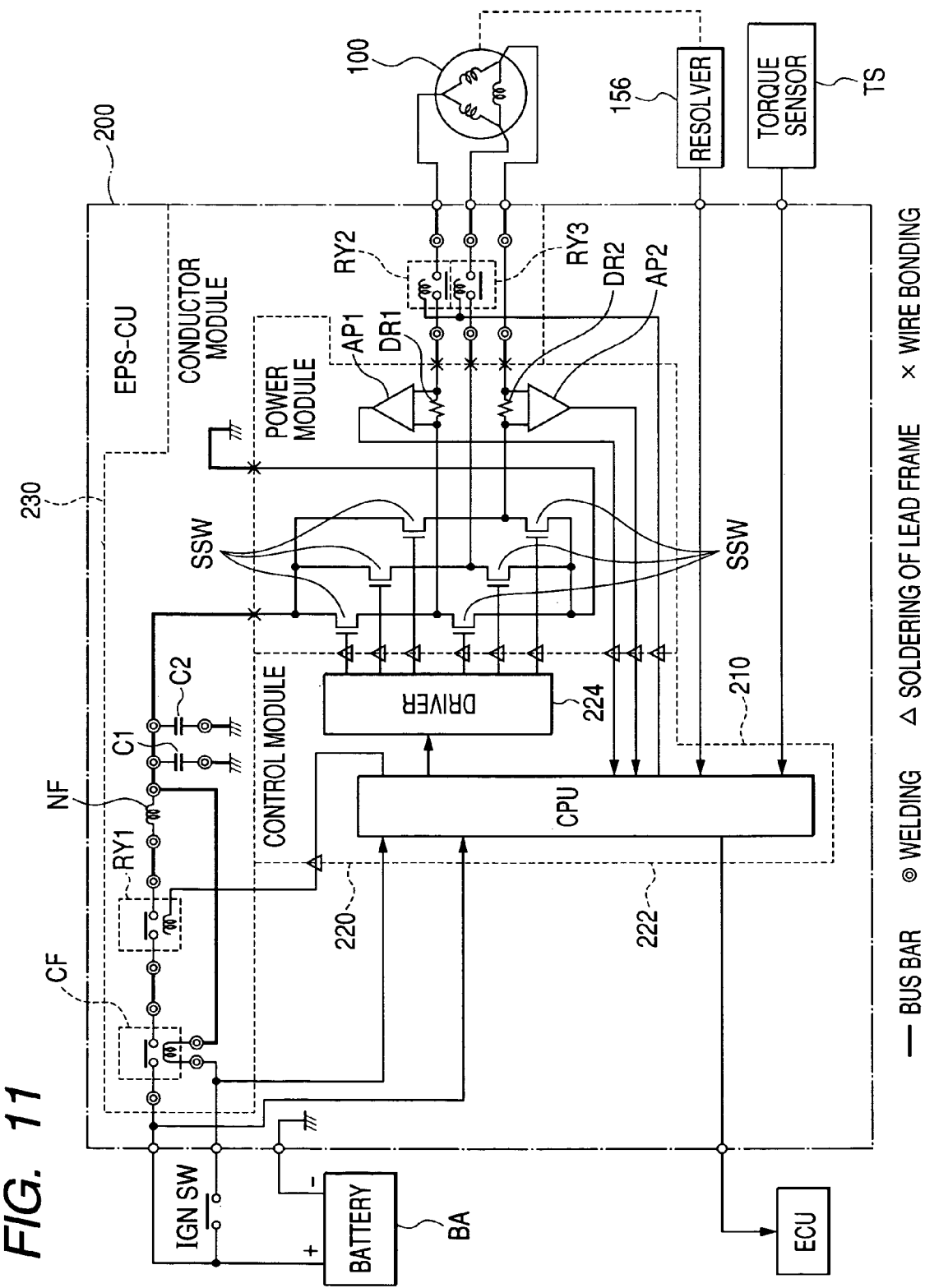
FIG. 11 is a circuit diagram representing the circuit configuration of the controller for controlling the motor for electric power steering as an embodiment of the present invention.

FIG. 11 is a circuit diagram representing the circuit configuration of the controller for controlling the motor for electric power steering as an embodiment of the present invention. The same reference numerals as those in FIG. 10 indicate the same parts.

The motor controller 200 comprises a power module 210, control module 220 and conductor module 230.

The conductor module 230 is integrally molded with the bus bar 230B. In the drawing, the bold solid line indicates the bus bar. In the conductor module 230, the common filter CF, normal filter NF, capacitors CC1 and CC2, and relay RY1 are connected to the bus bar—i.e. tubular conductor— for connecting the collector terminal of the semiconductor switching device SSW, as shown in the drawing. The relay RY1 is provided to protect against overcurrent for power current. The relays RY2 and RY3 provided to protect against overcurrent for motor current. All of these relays turn off the circuit when overcurrent occurs. They also discharge noise to the outside through the power line or prevent external noise from entering. The normal filter NF and capacitors CC1 and CC2 constitute a filter to minimize noise discharge and entry, particularly the adverse effect of the voltage pulsation of the power line resulting from the operation of the semiconductor switching device. Further, the common filter CF and normal filter NF are provided to avoid radio noise.

The portion indicated by a double circle denotes the welded connection. For example, the four terminals of the common filter CF are connected to the bus bar terminal by welding. Two terminals of the normal filter NF, two terminals of each of ceramic capacitors CC1 and CC2 and two terminals of the relay RY1 are also connected to the terminals of the bus bar by welding.

A bus bar is also used for wiring to supply motor current to the motor 100 from the power module 210. Relays RY2 and RY3 are connected by welding to the bus bar wire leading from the power module 210 to the motor 100. Relays RY1, RY2 and RY3 are used for the fail safe system to cut off power to the motor in the event of motor failure or control module trouble.

The control module 220 is provided with a CPU 222 and driver circuit 224. Based on the torque detected by the torque sensor TS and the rotary position of the motor 100 detected by the resolver 156, the CPU 222 outputs to the driver circuit 224 the control signal for controlling on-off operation of the semiconductor switching device SSW of the power module 210. Based on the control signal from the CPU 222, the driver circuit 224 controls the semiconductor switching device SSW of the power module 210. The motor current supplied from the power module 210 to the motor 100 is detected by resistors as motor current detection devices (shunt resistors) DR1 and DR2, and is amplified by the amplifiers AP1 and AP2. Then the current is inputted into the CPU 222. The CPU 222 provides feedback control to ensure that the motor current will be the target. The CPU 222 is connected by the external engine control ECU, CAN and others, whereby information is exchanged.

The $\Delta$ (inverted delta symbol) in the drawing indicates the portions connected by soldering using the lead frame. The structure is designed in such a way that stress is reduced by the use of the lead frame. The configuration of the lead frame will be described with reference to FIG. 15. Soldering using the lead frame is utilized for electrical connection between the control module 220 and power module 210 or conductor module 230.

The power module 210 comprises six semiconductor switching devices SSW such as IGBT. The semiconductor switching device SSW is serially connected to the upper and lower arms for each of three phases (U, V and W phases). In the drawing, a cross "x" denotes an electrical connection by wire bonding. To be more specific, motor current is supplied to the motor 100 from the power module 210 through the bus bar of the conductor module 230, but this current is as large as 100 amperes, for example. Accordingly, connection is made by wire bonding that allows a large current to run, and reduces the stress. The details will be described later with reference to FIG. 16. The power supply line and earth line for the semiconductor switching device SSW are also connected wire bonding.

Figure 12:
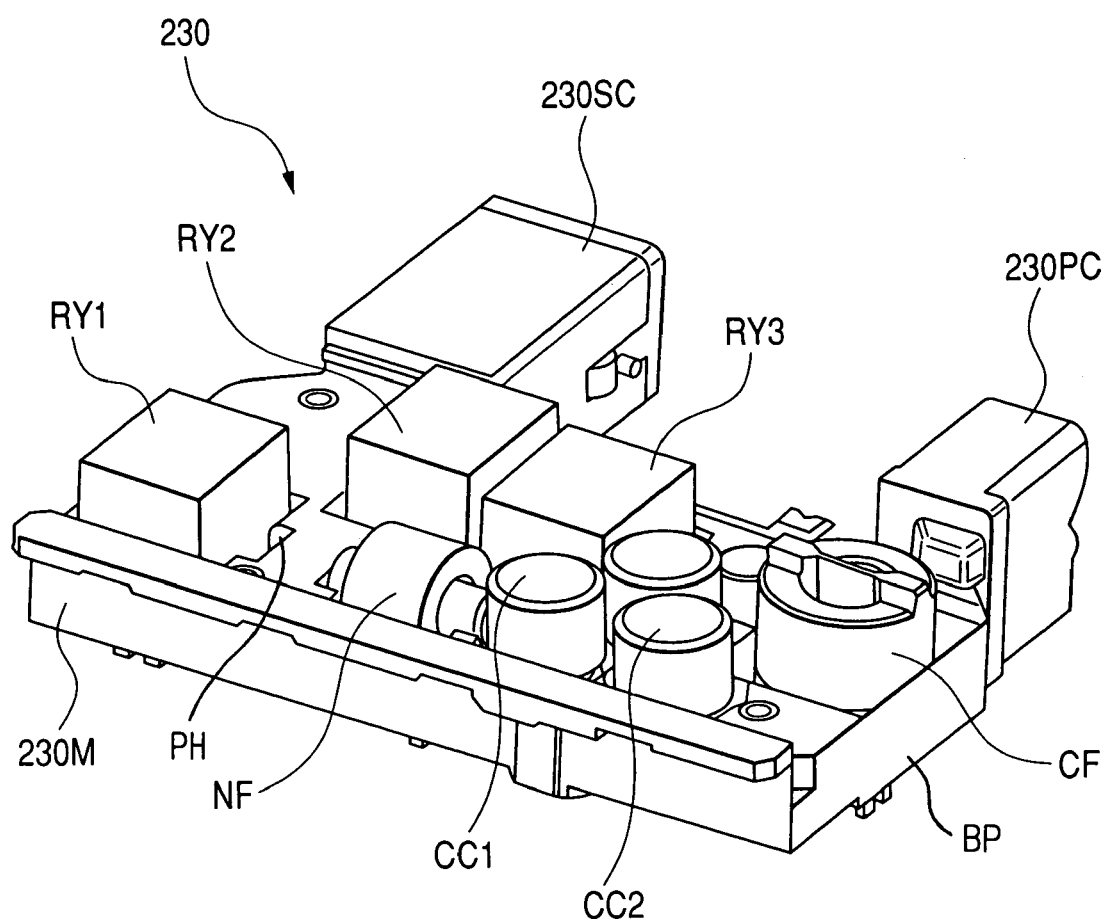
FIG. 12 is a perspective bottom view showing the configuration of the conductor module of the controller for controlling the motor for electric power steering as an embodiment of the present invention.

Referring to FIG. 12, the following describes the configuration of the conductor module 230 of the controller for controlling the motor for electric power steering of the present embodiment.

FIG. 12 is a perspective bottom view showing the configuration of the conductor module of the controller for controlling the motor for electric power steering as an embodiment of the present invention. The same reference numerals in FIGS. 10 and 11 indicate the same parts. FIG. 12 shows the bottom view of the conductor module 230 shown in FIG. 10.

The conductor module 230 is formed by molding, and has a bottom BP with a plate-formed conductor not shown and circuit parts. Said plate-formed conductor forms a circuit for sending 3-phase alternating current to be supplied to the motor for electric power steering. The bottom BP of said conductor module 230 is provided with a plurality of holes PH for inserting the terminals of electric parts such as the common filter CF, normal filter NF, capacitors CC1 and CC2, and relays RY1, RY2 and RY3. The electric parts are arranged on these positions, and the terminals of the electric parts and terminals of the bus bar are connected by welding on the illustrated bottom surface side. The connector 230SC is supplied with current from the battery as an on-board power supply. It also supplies 3-phase alternating current generated in the controller.

Figure 13:
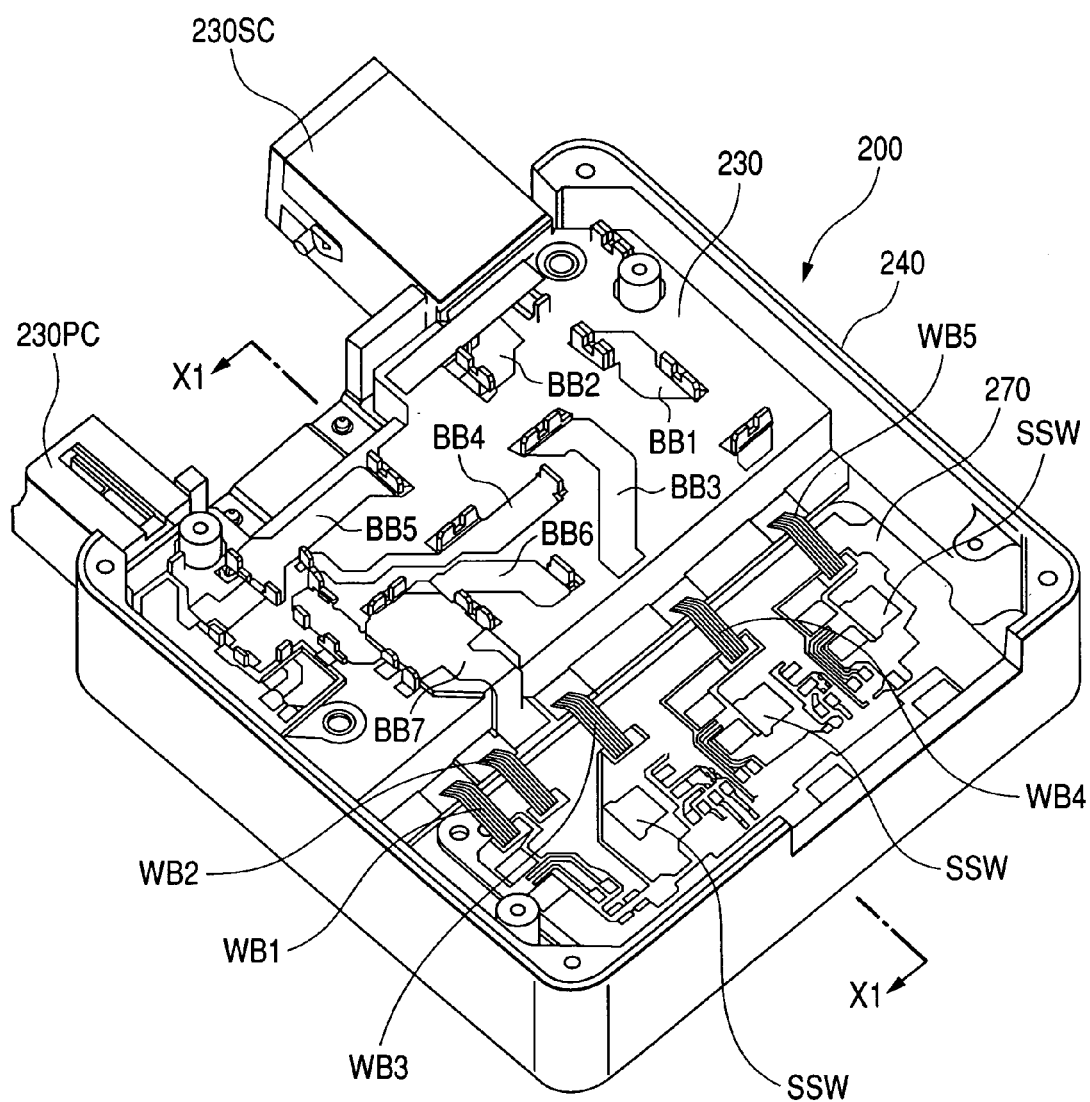
FIG. 13 is a perspective view showing the structure of the controller for controlling the motor for electric power steering as an embodiment of the present invention.

The conductor module 230 contains a resin-made longitudinal structural member denoted by reference numeral 230M on one side, and the 230SR and 230PC constituting a linkage connector on the other side. Such parts as a relay, filter and capacitor are located between them. The conductor module 230 is composed of a lower section BP and the aforementioned longitudinal structural member 230M. One end of the longitudinal structural member 230M is kept in contact with a fixed the bottom surface inside the case 240. In the meantime, the aforementioned low portion is located on the upper side, as shown in FIG. 13. Such parts as the aforementioned relay, filter and capacitor are incorporated and protected in the chamber formed by the lower section, longitudinal structural member 230M and case 240.

FIG. 13 is a perspective view showing the structure of the controller for controlling the motor for electric power steering as an embodiment of the present invention. The same reference numerals as those in FIG. 10 through 12 indicate the same parts. In FIG. 3, the power module 210 and conductor module 230 are mounted in the case 240, but the control module 220 is not yet installed.

In the conductor module 230, a plurality of bus bars, i.e. plate-formed conductors BB1, BB2, BB3, BB4, BB5, BB6 and BB7 are molded on the lower section of the conductor module 230. The terminals of the bus bars and the terminals of the electric parts such as the common filter CF, normal filter NF, ceramic capacitors CC1 and CC2, and relays RY1, RY2 and RY3 shown in FIG. 11 are welded together.

The power module 210 is provided with a plurality of semiconductor switching devices SSW. Wire bonding WB1, WB2, WB3, WB4, WB5 are used for electrical connection at five positions between the power module 210 and conductor module 230. Referring to the WB1 as one of them, five aluminum wires having a diameter of 500 µm are connected in parallel. In this case, wire bonding WB1 and WB2 constitute a circuit for supplying the current from the on-board power supply to the power module 210 from the conductor module 230. To put it another way, they are the connection as a d.c. voltage supply terminal for the power module composed of the capacitors C1 and C2 of FIG. 11, and the connection for grounding the power module. Wire bonding WB3, WB4 and WB5 are used to supply the generated 3-phase alternating current to the power module. The connections WB1 and WB2 associated with the power source are arranged on one side of the power module 210, and this arrangement ensures a simple wiring. Since regularity is created in the layout of the devices, the layout of switching devices is simplified.

The power module 210 and conductor module 230 are arranged on the same plane opposed to each other. To be more specific, the power module 210 is arranged on one side of the case 240. The conductor module 230 is placed on the other side of the case 240. This arrangement ensures easier wire bonding work.

Figure 14:
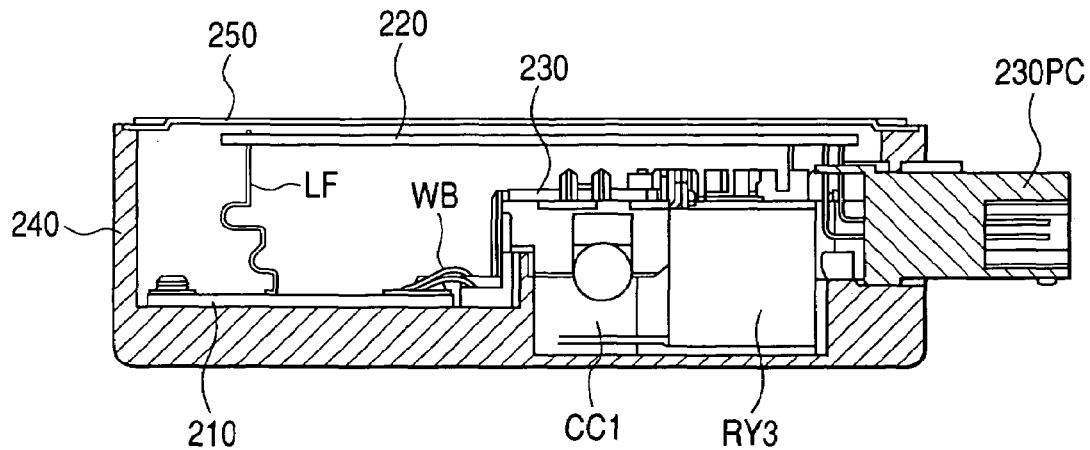
FIG. 14 is a cross sectional view of the controller for controlling the motor for electric power steering as an embodiment of the present invention.

FIG. 14 is a cross sectional view of the controller for controlling the motor for electric power steering as an embodiment of the present invention. It is a cross sectional a view taken along line X1-X1 of FIG. 13. The same reference numerals as those in FIGS. 10 through 13 indicate the same parts.

The power module 210 and conductor module 230 are fixed by screws on the inner bottom surface of the case 240. As shown in FIG. 11, the conductor module 230 are provided with electric parts and is welded together with the bus bar, thereby forming an integral module, which is fixed by screws. Then electrical connection between the power module 210 and conductor module 230 is provided by wire bonding WB.

The lower end of the lead frames LF is secured on the power module 210 by soldering. Under this condition, the control module 220 is placed thereon and the other end of the lead frames LF is secured on the terminal end of the control module 220 by soldering. The control module 220 is secured on the case 240 by screws. A shield cover 250 is then fixed on the case 240 by screws.

Figure 15:
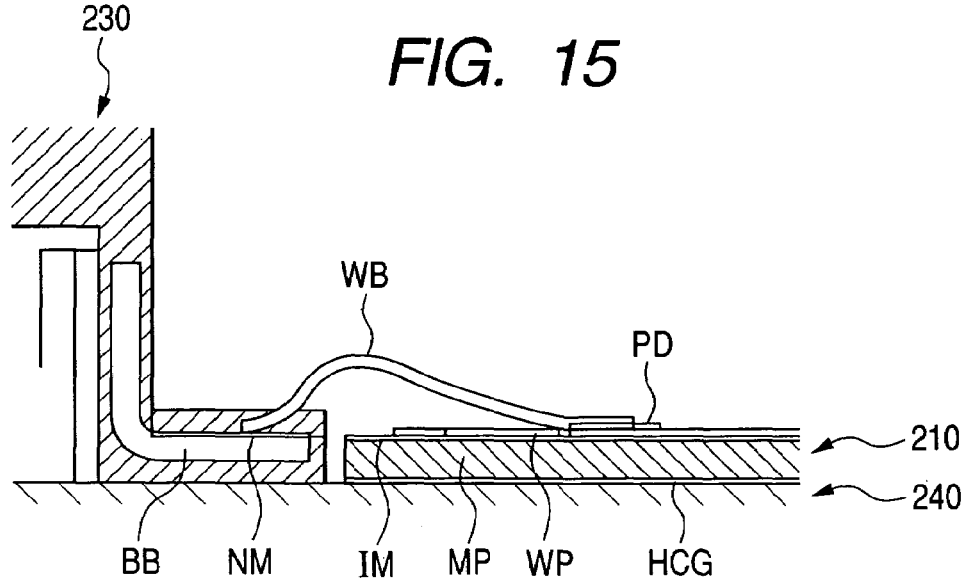
FIG. 15 is a cross sectional view representing the major portions of the controller for controlling the motor for electric power steering as an embodiment of the present invention.

FIG. 15 is a cross sectional view representing the major portions of the controller for controlling the motor for electric power steering as an embodiment of the present invention. The same reference numerals as those in FIG. 14 indicate the same parts.

FIG. 15 indicates a detailed structure of the connections between the power module 210 and conductor module 230.

The power module 210 is provided with a semiconductor switching device SSW. A metal substrate MP (e.g. aluminum (Al) and copper (Cu)) is used to release the heat thereof. Heat conduction grease HCG is applied between the metal substrate MP and case 240. Thus, the heat generated from the semiconductor switching device SSW is released from the aluminum case 240 through the metal substrate MP and heat conduction grease HCG. A wiring pattern WP is formed on the metal substrate MP through the insulation film IM. An insulation layer of low elasticity is used to produce the insulation film IM. The wiring pattern WP is obtained by etching and patterning a 175 µm-thick copper (Cu) foil. An aluminum pad PD used for electrical connection with the conductor module 230 is formed on the wiring pattern WP. A nickel film is formed on the back of the aluminum pad PD.

In the meantime, a bus bar BB is molded on the conductor module 230. On the end of the bus bar BB, a nickel film is formed on the surface of the connection with the power module 210.

Wire bonding WB is used for connection between the bus bar BB of the power module 210 and the aluminum pad PD of the conductor module 230 by means of an aluminum wire.

As described above, the metallic substrate is used as a substrate of the conductor module 230. This arrangement causes expansion coefficient to be increased. Since expansion and compression are repeated in conformity to the temperature change of the conductor module 230, stress is applied to the electrical connection with the power module 210. Because a large current runs between the power module 210 and conductor module 230, such a conductor as a bus bar is preferably utilized for connection. However, this may cause separation of the connection due to thermal stress. To solve this problem, an aluminum wire susceptible to reversible change is used in the present embodiment. This allows thermal deformation of the conductor module 230 to be absorbed by the aluminum wire, with the result that stress is not applied to the electrical connection. This provides a stress-free structure. However, to allow a large current to flow, five aluminum wires having a diameter of 500 μm are connected in parallel.

A wire pattern is obtained by etching and patterning a 175 μm-thick copper (Cu) foil. If the thickness is in the range from 105 through 200 μm, for example, resistance can be reduced, and the amount of heat generation can also be reduced in the face of a large current. It is more preferable to use a wire pattern having a thickness of 145 through 175 μm. Use of a wire pattern having a thickness of 145 μm or more allows the resistance to be reduced as compared to the thickness of 105 μm. The amount of heat generation can also be reduced in the face of a large current. Further, when a copper foil having a thickness of 200 μm is patterned by etching, the pattern pitch will be increased and a small chip resistor or chip capacitor may not be installed in some cases. If the thickness is 175 μm or less, smaller chip parts can be utilized.

Figure 16:
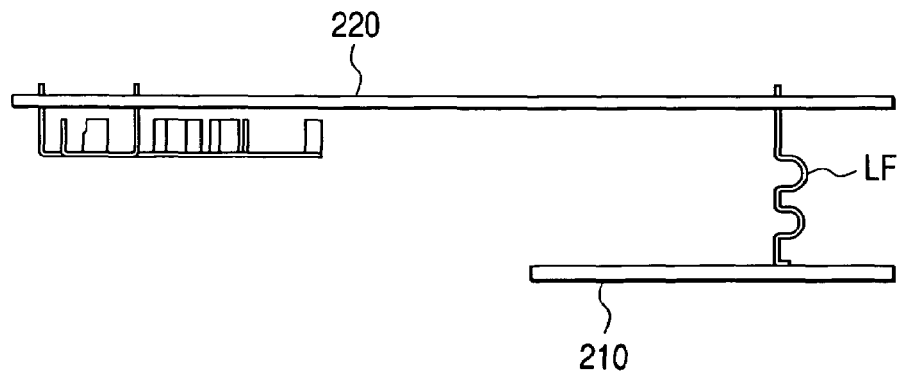
FIG. 16 is a cross sectional view representing the major portions of the controller for controlling the motor for electric power steering as an embodiment of the present invention.

FIG. 16 is a cross sectional view representing the major portions of the controller for controlling the motor for electric power steering as an embodiment of the present invention. The same reference numerals as those in FIG. 14 indicate the same parts.

The power module 210 and control module 220 are connected by the lead frames LF. The lead frames LF used in the present embodiment is made of a brass sheet material having a thickness of 0.15 μm, for example, and has a bend at some midpoint as shown in the drawing. As described above, the metal substrate MP is used as the substrate of the power module 210. Accordingly, the aforementioned lead frames LF is used to prevent thermal stress from being applied to the electrical connection between the power module 210 and control module 220. Soldering is used for connection between the power module 210 and one end of the lead frames LF, and between the control module 220 and the other end of the lead frames LF. This arrangement provides signal line connection with a stress-free structure.

Figure 17:
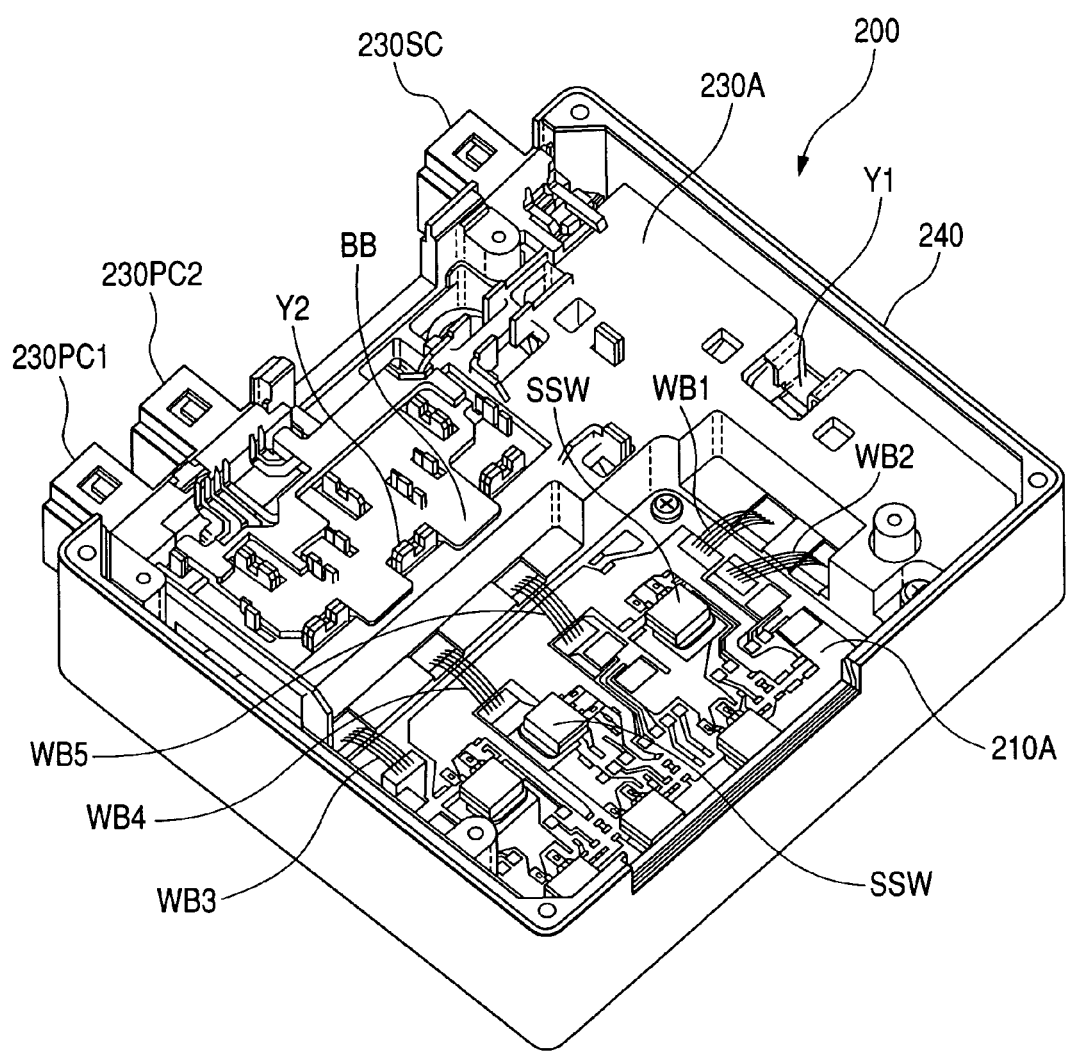
FIG. 17 is a perspective view representing another configuration of the controller for controlling the motor for electric power steering as an embodiment of the present invention.

Referring to FIG. 17, the following describes another configuration of the controller for controlling the motor for electric power steering of the present embodiment. FIG. 17 is a perspective view representing another configuration of the controller for controlling the motor for electric power steering as an embodiment of the present invention. The same reference numerals in FIGS. 10 through 16 indicate the same parts. Similarly to the case shown in FIG. 13, the WB1 and WB2 constitutes the circuits for supplying power to the power module, and the WB3 through WB5 provide connections for outputting the 3-phase alternating current. They are connected to the aforementioned WB1 and WB2 from the connector 230SC through the plate-formed conductor BB inside the conductor module 230.

Basically, the structure of the present embodiment is the same as shown in FIGS. 10 and 12. The circuit configuration is the same as shown in FIG. 11. FIG. 17 shows the power module 210 and conductor module 230A mounted in the case 240, where the control module 220 is not yet mounted.

In this example, the configuration of the conductor module 230A is slightly different from that of the conductor module 230 illustrated in FIG. 13. To be more specific, the conductor module 230A is L-shaped in its planer geometry, as compared with the conductor module 230 shown in FIG. 13 being flat and rectangular. The terminals of the electrolytic capacitor and ceramic capacitor are fixed to the bus bar by welding at the portion Y1. At anther portion Y2, the terminals of the relay, normal filter and common filer are secured to the bus bar by TIG welding (arc welding), as in FIG. 13.

As shown in FIGS. 12, 13, 14 and 17, the conductor module 230 is composed of a lower section and the aforementioned longitudinal structural member 230M. The lower portion is provided with a plate-formed conductor for allowing current to be supplied to the stator coil of the motor. The longitudinal structural member 230M is constructed higher than the relay, filter or capacitor. With the lower section located upward, the longitudinal structural member 230M is installed on the bottom inside the case 240, whereby the relay, filter and capacitor can be held in a chamber created between the lower section and the internal bottom of the case 240. This arrangement allows the apparatus to be downsized. It further protects the aforementioned circuit parts and prevents the parts from being damaged during the production work. As is clear from FIGS. 13 and 14, the conductor module 230 has a longitudinal structural member 230M arranged on the power module 210. The connector 230SC for connection of the stator coil and control connector 230PC are provided on the opposite side. After these connectors and conductor module 230 have been fixed in position, they are mounted in the case 240, with the result that effective assembling work is ensured. To connect between the connector 230SC and conductor module 230, the end of the connector terminal and the end of the plate-formed conductor BB of the conductor module 230 are bent so that they each will face upward in FIGS. 12 and 13. The bent portions are placed one on top of the other, and the overlapped portions are welded together. This configuration and procedure provides connections capable of withstanding a large current, allows effective connection work, and ensures a great deal of resistance to vibration.

As can be seen from FIG. 13 or FIG. 17, when the conductor module 230 is mounted in the case, the plate-formed conductor BB of the conductor module 230 is located above the relay, filter and capacitor. The relay, filter and capacitor are connected in such a way that the connection of the plate-formed conductor is bent upward, and the bent portion of the plate-formed conductor and the terminal of the parts overlap with each other. This arrangement ensures easy connection of the overlapped portions by welding, for example, and provides a large connection area, with the result that a large current is allowed to run.

In the structure given in FIGS. 13, 14 and 17, a conductor module 230 is arranged on at least one side of the case, i.e. on the side of the connector 230SC for connection with the motor. This permits easy automation of the work of connecting the power module 210 to the conductor module 230. Parts are protected as described above, and therefore they are also protected during the connection work. In the final step, the control module 220 is secured on the power module 210. This arrangement permits the apparatus itself to be downsized, and ensures an easy manufacturing procedure.

As will be further illustrated in FIGS. 10 and 14, the control module 220 is mounted on the upper portion of FIGS. 13 and 17. The control module 220 and power module 210 are connected by the lead frame LF as a lead by soldering. There is no need of using welding on the top surface of the case 240, i.e. one surface; all connection can be made by soldering. This method ensures effective connection work and assembling work.

As described above, connection between the power module 210 and conductor module 230 is provided by welding, according to the present embodiment. The control module 220 and power module 210 are connected by soldering. In this method, welding is used for the portion exposed to a large current in order to avoid possible melting as a result of soldering, thereby improving reliability. Further, other positions are connected by soldering, whereby manufacturability is improved.

Further, the power module 210 and conductor module 230 are connected by wire bonding, whereby stress on a large current line can be reduced. Further, parallel connection of a plurality of wires allows a large current to run.

The power module 210 and conductor module 230 are arranged opposite to each other on the bottom surface of the case. To put it another way, the power module 210 is arranged on one side of the case 240 and the conductor module 230 is placed on the other side of the case. This arrangement ensures easy wire bonding work.

What is claimed is:

1. An electric power steering system comprising:
    a motor for electric power steering; and
    a controller generating alternating current for driving said motor;
    said motor for electric power steering comprising:
    a stator equipped with a stator coil; and
    a rotor supported rotatably inside said stator;
    said stator being equipped with a stator coil wherein the stator core is split, and the stator core is integrally constructed thereafter;
    said rotor comprising:
    a rotor core; and
    a plurality of magnets secured on the surface of said rotor core; wherein said magnets whose stator side is curved and whose polarity reverses alternately in the circumferential direction are magnetized in the axial direction;
    said motor for electric power steering further comprising:
    a connection board on the side of the stator for supplying alternating current to the stator coil;
    said controller incorporating:
    a power module equipped with a semiconductor switching device;
    a conductor module; and
    a control module; inside the case;
    said control module supplying said power module with the control signal for generating the control signal for controlling said semiconductor switching device and driving the motor for electric power steering;
    said power module containing a semiconductor switching device, and generating 3-phase alternating current for driving said motor in conformity to said control signal;
    said conductor module comprising:
    a bottom formed of resin;
    a plate-formed conductor provided on said bottom;
    a relay; and
    a capacitor;
    wherein said plate-formed conductor forms a circuit for sending 3-phase alternating current to be supplied to the motor for electric power steering;
    wherein said conductor module is secured onto one side of the case interior in such a way that the bottom thereof will be located at the upper position;
    said power module is arranged on the other side of the case interior; and
    said power module and plate-formed conductor of the conductor module are electrically connected;
    wherein a chamber is formed between the bottom of the case and the bottom of the conductor module arranged in such a way that the bottom thereof will be located at the upper position; and said relay and capacitor are arranged in the chamber;
    wherein a hole is provided on the bottom of said conductor module arranged in such a way that the bottom thereof will be located at the upper position; said relay and capacitor terminals protrude from the hole; and said protruding terminals and plate-formed conductor are connected by welding; and
    wherein the alternating current generated by the power module is supplied to the stator coil through the connection board for the motor for electric power steering.

2. The electric power steering system described in claim 1 wherein welded connection between said power module and conductor module is accomplished by connecting a plurality of wires by wire bonding.

3. A controller for electric power steering wherein a power module containing a semiconductor switching device, a conductor module and a control module are arranged in a case;
    wherein said control module controls the semiconductor switching device of the power module and supplies said power module with the control signal for generating the 3-phase alternating current to drive the motor for electric power steering;
    wherein said power module contains a semiconductor switching device, and generates 3-phase alternating current for driving said motor in conformity to said control signal; said conductor module comprising:
    a bottom formed of resin;
    a plate-formed conductor provided on said bottom;
    a filter; and
    a capacitor;
    wherein said plate-formed conductor forms a circuit for sending 3-phase alternating current to be supplied to the motor for electric power steering;
    wherein said conductor module is secured onto one side of the case interior in such a way that the bottom thereof will be located at the upper position, said power module is arranged on the other side of the case interior, and said power module and plate-formed conductor of the conductor module are electrically connected;
    wherein a chamber is formed between the bottom of the case and the bottom of the conductor module arranged in such a way that the bottom thereof will be located at the upper position, and said filter and capacitor are arranged in the chamber;
    wherein a hole is provided on the bottom of said conductor module arranged in such a way that the bottom thereof will be located at the upper position, said filter and capacitor terminals protrude from the hole, and said protruding terminals and plate-formed conductor are connected by welding; and
    wherein said control module is mounted on said power module, and said power module and control module are connected by soldering.

4. A controller for electric power steering wherein a power module containing a semiconductor switching device, a conductor module and a control module are arranged in a case;
    wherein said control module controls the semiconductor switching device of the power module and supplies said power module with the control signal for generating the 3-phase alternating current to drive the motor for electric power steering;
    wherein said power module contains a semiconductor switching device, and generates 3-phase alternating current for driving said motor in conformity to said control signal;
    wherein said conductor module contains a longitudinal structural member formed of resin, a bottom, a plate-formed conductor arranged on said bottom, a relay and a capacitor; and the plate-formed conductor constitutes an electric circuit for sending 3-phase alternating current to be supplied to the motor for electric power steering;

wherein said conductor module is secured onto one side of the case interior in such a way that the bottom thereof will be located at the upper position, a chamber is formed between the bottom of the case and the bottom of the conductor module arranged in such a way that the bottom thereof will be located at the upper position, and said relay and capacitor are arranged in the chamber;

wherein a hole is provided on the bottom of said conductor module arranged in such a way that the bottom thereof will be located at the upper position, said filter and capacitor terminals protrude upwardly from the hole, part of the plate-formed conductor is bent upward, and the upward bent part of the plate-formed conductor, and the protruding terminals of said filter and said capacitor are electrically connected;

wherein said power module is arranged in the chamber arranged between the conductor module of the case interior and the other side of the case interior;

wherein said power module and the plate-formed conductor of the conductor module are electrically connected through wire bonding;

wherein said control module is mounted on said power module, and said power module and control module are connected by soldering; and wherein a connector for supplying the motor for electric power steering with 3-phase alternating current is arranged on the side of said case on the conductor module side.

* * * * *